(12) United States Patent
Hong et al.

(10) Patent No.: US 7,602,455 B2
(45) Date of Patent: Oct. 13, 2009

(54) ARRAY SUBSTRATE FOR TRANSFLECTIVE LIQUID CRYSTAL DISPLAY DEVICE AND FABRICATION METHOD THEREOF

(75) Inventors: Hyun-Seok Hong, Goyang-si (KR); Byung-Ho Park, Pyohang-si (KR)

(73) Assignee: LG Display Co., Ltd., Seoul (KR)

( * ) Notice: Subject to any disclaimer, the term of this patent is extended or adjusted under 35 U.S.C. 154(b) by 582 days.

(21) Appl. No.: 11/289,459

(22) Filed: Nov. 30, 2005

(65) Prior Publication Data
US 2007/0002221 A1 Jan. 4, 2007

(30) Foreign Application Priority Data
Jun. 30, 2005 (KR) .................. 10-2005-0057903

(51) Int. Cl.
*G02F 1/136* (2006.01)
(52) U.S. Cl. ........................................ 349/43
(58) Field of Classification Search ............ 349/43
See application file for complete search history.

(56) References Cited

U.S. PATENT DOCUMENTS

| | | | | |
|---|---|---|---|---|
| 6,567,150 B1 * | 5/2003 | Kim | ............... | 349/187 |
| 6,614,500 B2 * | 9/2003 | Kim | ............... | 349/152 |
| 6,771,346 B2 * | 8/2004 | Sugimoto et al. | ............ | 349/149 |

* cited by examiner

*Primary Examiner*—James A Dudek
(74) *Attorney, Agent, or Firm*—Birch, Stewart, Kolasch & Birch, LLP

(57) ABSTRACT

An array substrate for a transflective liquid crystal display device and its fabrication method are discussed. In one embodiment, a method of forming an array substrate for a display device, includes forming a gate pad on a pad region of a base substrate; forming a gate insulator on the gate pad, the gate insulator having an opening exposing a portion of the gate pad; forming an auxiliary pad pattern on the gate insulator, the auxiliary pad pattern being made of an intrinsic amorphous silicon layer; and forming a conductive layer on the auxiliary pad pattern, the conductive layer contacting the gate pad through the opening.

18 Claims, 26 Drawing Sheets

US 7,602,455 B2

ARRAY SUBSTRATE FOR TRANSFLECTIVE LIQUID CRYSTAL DISPLAY DEVICE AND FABRICATION METHOD THEREOF

This application claims under 35 U.S.C. §119 the priority benefit of Patent Application No. 10-2005-0057903 filed in Republic of Korea on Jun. 30, 2005, which is hereby incorporated by reference for all purposes as if fully set forth herein.

BACKGROUND OF THE INVENTION

1. Field of the Invention

The present invention relates to an array substrate for a transflective liquid crystal display device and a fabrication method thereof, and more particularly, to a pad region of an array substrate for a transflective liquid crystal display device and a fabrication method thereof.

2. Discussion of the Related Art

As the information-oriented age is advancing, display devices for disposing and displaying information are actively being developed. More particularly, a flat panel display device, e.g., a liquid crystal display device, having a small thickness, lightness weight and a low power consumption, has been actively studied. The liquid crystal display device displays images by controlling a transmittance of light. In other words, a liquid crystal is interposed between two substrates facing each other, and then liquid crystal molecules move by an electric field generated from applying a voltage to electrodes, thereby the transmittance of light changes.

However, the liquid crystal display device needs a separate light source, because it does not emit a light itself. Accordingly, a backlight is disposed on the rear surface of a liquid crystal panel, and images are displayed by a light emitted from the backlight and incident to the liquid crystal panel. Above-mentioned liquid crystal display device is referred to as a transmission type liquid crystal display device. The transmission type liquid crystal display device may display bright images in a dark outside environment due to using a separate light source such as a backlight, but may have a large power consumption according to the backlight.

To solve this problem, a reflection type liquid crystal display device has been suggested. The reflection type liquid crystal display device controls a transmittance of light according to an arrangement of a liquid crystal by reflecting an outside natural light or artificial light. Although the reflection type liquid crystal display device may have lower power consumption than the transmission type liquid crystal display device, it may have low brightness when the outside light is insufficient or weak.

Accordingly, to solve these problems, a transflective liquid crystal display device complementing respective problems of the transmission type liquid crystal display device and reflection type liquid crystal display device has been suggested. The transflective liquid crystal display device may select a transmission mode using a backlight light and a reflection mode using an outside light.

FIG. 1 is a plan view illustrating an array substrate for a transflective liquid crystal display device according to a related art. As shown in FIG. 1, a pixel region P is defined by crossing a gate line 12 and a data line 14 on a transparent substrate 10, and a thin film transistor T is disposed at the crossing of the gate and data lines 12 and 14. A gate pad 40 is formed in one end of the gate line 12, and a gate pad contact hole 42 exposing a part of the gate pad 40 is formed. A pixel electrode 26 connected to the thin film transistor T through a drain contact hole 24 is formed.

The pixel region P has a reflection area RA and a transmission area TA. The reflection area RA is formed in the rest region excluding a middle region of the pixel region P, and has a reflection plate 19 formed on the pixel electrode 26. The transmission area TA is formed in the middle region of the pixel region P and does not have the reflection plate 19. An embossing pattern 30 with a convex circle shape is formed in the reflection area RA in order to prevent a specular reflection.

The thin film transistor T in the reflection area RA includes a gate electrode 16 obtaining a scan signal from the gate line 12, a source electrode 18 obtaining an image signal from the data line 14, a drain electrode 20 being apart from the source electrode 18, and an active layer 22 between the gate electrode 16 and the source and drain electrodes 18 and 20.

FIGS. 2A to 2H are cross-sectional views cutting along line II-II' of FIG. 1 and illustrating a process of forming of an array substrate for a transflective liquid crystal display device according to the related art. FIGS. 3A to 3H are cross-sectional views cutting along line III-III' of FIG. 1 and illustrating a process of forming of an array substrate for a transflective liquid crystal display device according to the related art. It will be explained a thin film transistor region and a gate pad region, respectively, with a four mask process.

As shown in FIG. 2A and FIG. 3A, a first metal layer 11 is formed on a transparent substrate 10. Then, as a first mask process, a photoresist 13 (it will be referred to as 'PR layer') of a positive type where a part receiving a light is exposed and developed is spread on the first metal layer 11, and a mask 50 having a transmission zone A and a barrier zone B is disposed on the substrate 10 having the PR layer 13. Then, the first metal layer 11 exposed by an exposing process and a developing process is etched, and then the remaining PR layer 13 is eliminated by an ashing process. As a result, the gate electrode 16 is formed in the reflection area RA of the substrate 10 as shown in FIG. 2B, and the gate pad 40 is formed in the transmission area TA of the substrate 10 as shown in FIG. 3B.

Next, as shown in FIG. 2C, a gate insulator 15, an intrinsic amorphous silicon layer 22A, an impurity-doped amorphous layer 22B, and a second metal layer 21 are formed on the entire surface of the substrate 10 having the gate electrode 16, in turn. As shown in FIG. 3C, a gate insulator 15, an intrinsic amorphous silicon layer 22A, an impurity-doped amorphous layer 22B, and a second metal layer 21 are formed on the entire surface of the substrate 10 having the gate pad 40, in turn.

Next, as shown in FIG. 2D, by a second mask process, source and drain electrodes 18 and 20 and an active layer 22 are formed. The active layer 22 refers to the exposed portion of the intrinsic amorphous silicon layer 22A. Though not shown in FIG. 2D, the second mask process will be briefly explained. A PR layer is spread on the second metal layer 21, and then a mask having a transmission-zone, a barrier-zone and a semitransparent-zone is disposed on the substrate 10 having the PR layer. The semitransparent-zone of the mask corresponds to the gate electrode 16, and the PR layer corresponding to the semitransparent-zone is exposed with only one portion. As the mask, a half-tone mask or a diffraction mask may be used. After etching the portions of the exposed second metal layer 21, the intrinsic amorphous silicon layer 22A, and the impurity-doped amorphous layer 22B, a portion corresponding to the gate electrode 16 is etched partially, thereby forming the source and drain electrodes 18 and 20 and an active layer 22. In the pad region, as the above-mentioned second mask process, the gate insulator 15 only remains as shown in FIG. 3D by using a mask having a transmission zone.

Next, as shown in FIG. 2E, a passivation layer 17 is formed by spreading one of transparent organic insulating materials such as benzocyclobutene (BCB) and acryl group resin on the source and drain electrodes 18 and 20 and the exposed gate insulator 15 as shown in FIG. 2E, and on the entire surface of the gate insulator 15 as shown in FIG. 3E.

Next, a third mask using a half-tone mask or a diffraction mask is used. As shown in FIG. 2E, a mask 60 having a transmission-zone A, a barrier-zone B and semitransparent-zone C is disposed on the substrate 10 having the passivation layer 17. The barrier-zone B and the semitransparent-zone C are alternatingly disposed for the reflection area RA in order to form the embossing pattern 30. The transmission-zone A is disposed corresponding to the drain electrode 20 in order to form a drain contact hole 24 (shown in FIG. 2F). As shown in FIG. 3E, a mask 60 having a transmission-zone A and a barrier-zone B is disposed on the substrate 10 having the passivation layer 17. The passivation layer 17 is a positive type where a part receiving a light is exposed and developed.

Next, after an exposing process, a developing process and a heat treatment are processed, an embossing-patterned passivation layer 17 and a drain contact hole 24 exposing the active layer 22 are formed as shown in FIG. 2F, and a patterned passivation layer 17 exposing a portion of the gate insulator 15 corresponding to the gate pad 40 is formed as shown in FIG. 3F.

Next, as shown in FIG. 2G, a transparent conductive material 26 and a reflection layer 19 are formed on the embossing-patterned passivation layer 17 and the gate insulator 15 exposed in the transmission area TA, in turn. The transparent conductive material 26 may be either indium-tin-oxide (ITO) or an indium-zinc-oxide (IZO). The indium-tin-oxide (ITO) 26 and the reflection layer 19 are disposed according to the shape of the embossing-patterned passivation layer 17. As shown in FIG. 3G, after a gate pad contact hole 42 exposing a portion of the gate pad 40 is formed by etching a portion of the gate insulator 15 exposed between the patterned passivation layer 17, an indium-tin-oxide (ITO) 26 and a reflection layer 19 are disposed on the patterned passivation layer 17 and exposed gate pad 40, in turn.

Next, a fourth mask using a half-tone mask or a diffraction mask is used. As shown in FIG. 2H, a PR layer 25 of a positive type is spread on the reflection layer 19, and then a half-tone mask 70 having a barrier-zone B corresponding to the reflection area RA and a semitransparent-zone C corresponding to the transmission area TA is disposed on the substrate 10 having the PR layer 25. As a result, the PR layer 25 having a height (thickness) that is ½ of the height of the PR layer 25 in the reflection area RA, is formed in the transmission area TA. The PR layer 25 in the TA of FIG. 2H is referred to as a half PR.

In the pad region of FIG. 3H, the PR layer 25 is spread on the reflection layer 19, and should be formed to have the same height as the PR layer 25 formed in the transmission area TA of FIG. 2H. However, as shown in FIG. 3H, because a step created by the patterned passivation layer 17 is high, a PR layer 25 corresponding to the transmission area TA of FIG. 3H is not formed as the same as the PR layer 25 corresponding to the transmission area TA of FIG. 2H. In other words, because a step in the pad region is high, formation of the half PR is difficult. As a result, during the ashing process that will be performed next, the indium-tin-oxide (ITO) 26 and the patterned passivation layer 17 may be damaged by the step, which in turn causes the contact between the gate pad 40 and the indium-tin-oxide (ITO) 26 to be weak or incomplete, which is a problem. Accordingly, the method of forming a transflective liquid crystal display device using the four mask process according to the related art may be ineffective, complex and expensive.

SUMMARY OF THE INVENTION

Accordingly, the present invention is directed to an array substrate for a transflective liquid crystal display device that substantially obviates one or more of problems due to limitations and disadvantages of the related art.

An object of the present invention is to provide an array substrate for a transflective liquid crystal display device that lowing a step of a pad region by eliminating or reducing a thickness of a passivation layer of the pad region.

Another object of the present invention is to provide a fabrication method of an array substrate for a transflective liquid crystal display device using a four mask process by forming a half PR.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, according to an aspect of the present invention, there is provided a fabrication method of an array substrate for a transflective liquid crystal display device, the method comprising: forming a gate pad on a substrate through a first mask process; sequentially forming a gate insulator, an intrinsic amorphous silicon layer, an impurity-doped amorphous silicon layer and a metal layer on the gate pad; forming, in a pad region, a first auxiliary pad pattern having a first opening exposing a portion of the gate insulator, by selectively etching the metal layer, the impurity-doped amorphous silicon layer and the intrinsic amorphous silicon layer through a second mask process, the first auxiliary pad pattern including the intrinsic amorphous silicon layer; and forming a passivation layer on the first auxiliary pad pattern and the exposed gate insulator.

According to another aspect of the present invention, there is provided a fabrication method of an array substrate for a transflecfive liquid crystal display device, the method comprising: forming a gate pad on a substrate through a first mask process; sequentially forming a gate insulator, an intrinsic amorphous silicon layer, an impurity-doped amorphous silicon layer, and a metal layer on the gate pad; eliminating the metal layer, the impurity-doped amorphous silicon layer and the intrinsic amorphous silicon layer through a second mask process; forming a passivation layer on the gate insulator and having an opening exposing the gate insulator through a third mask process; exposing a portion of the gate pad by etching the gate insulator exposed through the opening; sequentially forming a transparent conductive layer and a reflection layer on the exposed gate pad; forming a gate pad terminal by forming a half photoresist on the reflection layer and selectively etching the reflection layer and the transparent conductive layer through a fourth mask process; and eliminating the reflection layer in the gate pad terminal.

According to anther aspect of the present invention, there is provided an array substrate for a transflective liquid crystal display device, the array substrate comprising: a gate pad on a base substrate; a gate insulator on the gate pad and having an opening exposing a portion of the gate pad; an auxiliary pad pattern on the gate insulator and made of an intrinsic amorphous silicon layer; and a conductive layer on the auxiliary pad pattern and contacting the gate pad through the opening.

According to anther aspect of the present invention, there is provided an array substrate for a transflective liquid crystal display device, the array substrate comprising: a gate pad on a base substrate and in a pad region; a gate insulator on the gate pad and having an opening exposing a portion of the gate pad; and conductive layer on the gate insulator and contacting the gate pad through the opening.

According to anther aspect of the present invention, there is provided a method of forming an array substrate for a display device, the method comprising: forming a gate pad on a pad region of a base substrate; forming a gate insulator on the gate pad, the gate insulator having an opening exposing a portion of the gate pad; forming an auxiliary pad pattern on the gate insulator, the auxiliary pad pattern being made of an intrinsic amorphous silicon layer; and forming a conductive layer on the auxiliary pad pattern, the conductive layer contacting the gate pad through the opening.

According to anther aspect of the present invention, there is provided a method of forming an array substrate for a display device, the method comprising: forming a gate pad on a pad region of a base substrate; forming a gate insulator on the gate pad, the gate insulator having an opening exposing a portion of the gate pad; and forming a conductive layer on the gate insulator, the conductive layer contacting the gate pad through the opening.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the illustrated embodiments of the present invention, which are illustrated in the accompanying drawings.

Figure 4:
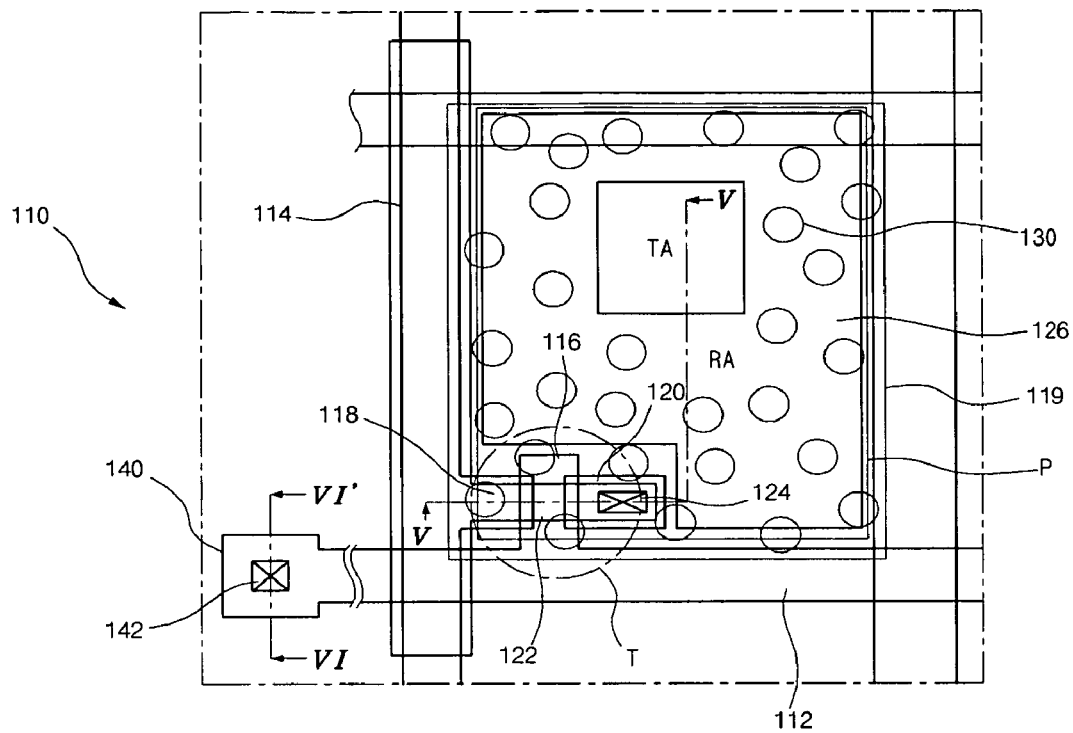
FIG. 4 is a plan view illustrating an array substrate for a transflective liquid crystal display device according to the present invention.

FIG. 4 is a plan view illustrating an array substrate for a transflective liquid crystal display device according to the present invention. Although one pixel region P is shown and described below, one skilled in the art would readily appreciate that the transflective liquid crystal display device of FIG. 4 includes a plurality of such pixel regions defined by gate lines and data lines crossing each other in a matrix configuration.

As shown in FIG. 4, a pixel region P is defined by crossing a gate line 112 and a data line 114 on a transparent substrate 110, and a thin film transistor T is disposed at the crossing of the gate and data lines 112 and 114. A gate pad 140 is formed in one end of the gate line 112, a gate insulator is formed on the gate pad 140, and a gate pad contact hole 142 exposing a part of the gate pad 140 is formed in the gate insulator. A pixel electrode 126 connected to the thin film transistor T through a drain contact hole 124 is formed.

The pixel region P has a reflection area RA and a transmission area TA. The reflection area RA is formed in the pixel region excluding a middle region of the pixel region P and has a reflection plate 119 formed on the pixel electrode 126. The transmission area TA is formed in the middle region of the pixel region P and does not have the reflection plate 119. An embossing pattern 130 with one or more convex circle shapes is formed in the reflection area RA in order to prevent a specular reflection.

The thin film transistor T in the reflection area RA includes a gate electrode 116 obtaining a scan signal from the gate line 112, a source electrode 118 obtaining an image signal from the data line 114, a drain electrode 120 being apart from the source electrode 118, and an active layer 122 between the gate electrode 116 and the source and drain electrodes 118 and 120.

FIGS. 5A to 5J are cross-sectional views cutting along line V-V' of FIG. 4 and illustrating a process of forming of an array substrate for a transflective liquid crystal display device according to the present invention. FIGS. 6A to 6J are cross-sectional views cutting along line VI-VI' of FIG. 4 and illustrating a process of forming of an array substrate for a transflective liquid crystal display device according to a first exemplary embodiment of the present invention. FIGS. 5A-5J pertain to a thin film transistor region whereas FIGS. 6A-6J pertain to a gate pad region and thus the regions will be explained respectively according to the four mask process.

Figure 5A:
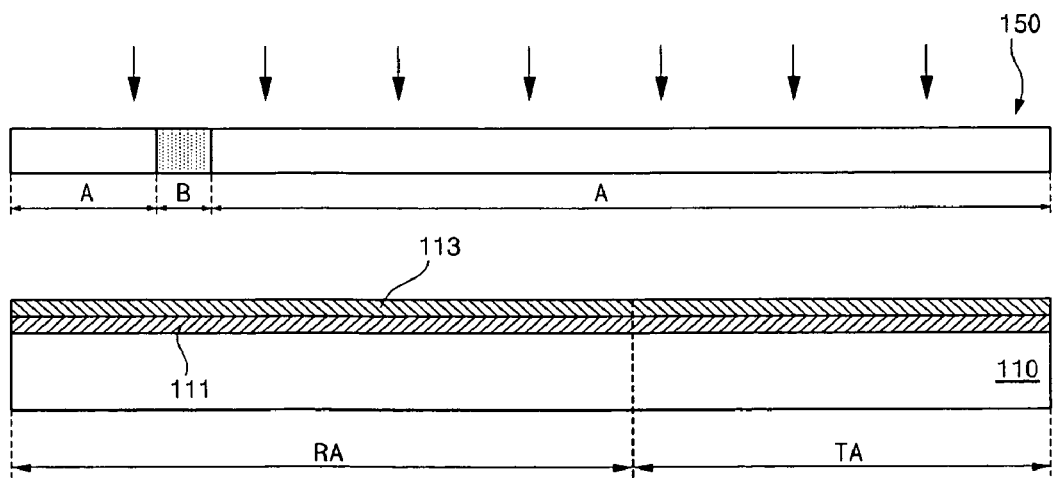
FIGS. 5A to 5J are cross-sectional views cutting along line V-V' of FIG. 4 and illustrating a process of forming of an array substrate for a transflective liquid crystal display device according to the present invention.
Figure 5B:
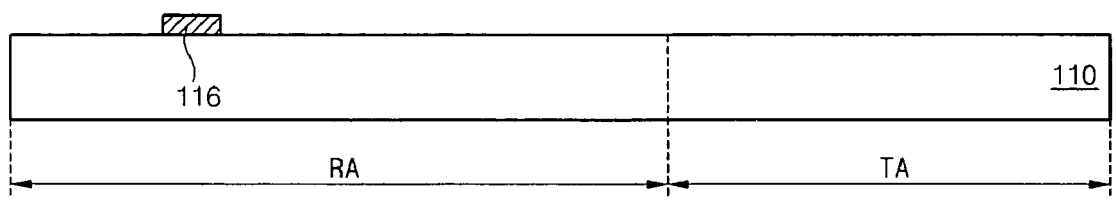
Figure 6A:
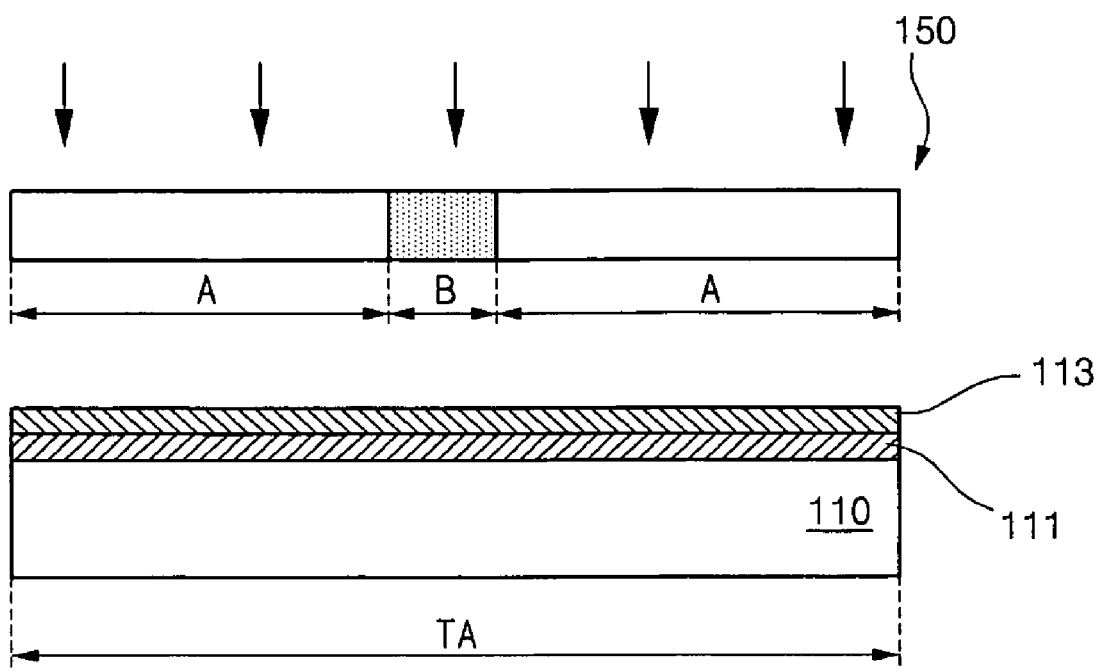
FIGS. 6A to 6J are cross-sectional views cutting along line VI-VI' of FIG. 4 and illustrating a process of forming of an array substrate for a transflective liquid crystal display device according to a first exemplary embodiment of the present invention.
Figure 6B:
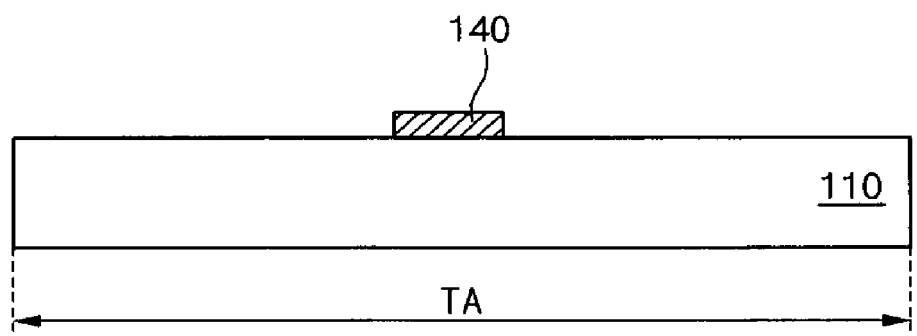

As shown in FIG. 5A and FIG. 6A, a first metal layer 111 is formed on a transparent substrate 110. Then, as a first mask process, a photoresist 113 (it will be referred to as 'PR layer') of a positive type where a part receiving a light is exposed and developed is spread on the first metal layer 111, and a mask 150 having a transmission-zone A and a barrier-zone B is disposed on the substrate 110 having the PR layer 113. Then, the first metal layer 111 exposed by an exposing process and a developing process is etched, and then the remaining PR layer 113 is eliminated by an ashing process. As a result, the gate electrode 116 is formed in the reflection area RA of the substrate 110 as shown in FIG. 5B, and the gate pad 140 is formed in the transmission area TA of the substrate 110 as shown in FIG. 6B.

Figure 5C:
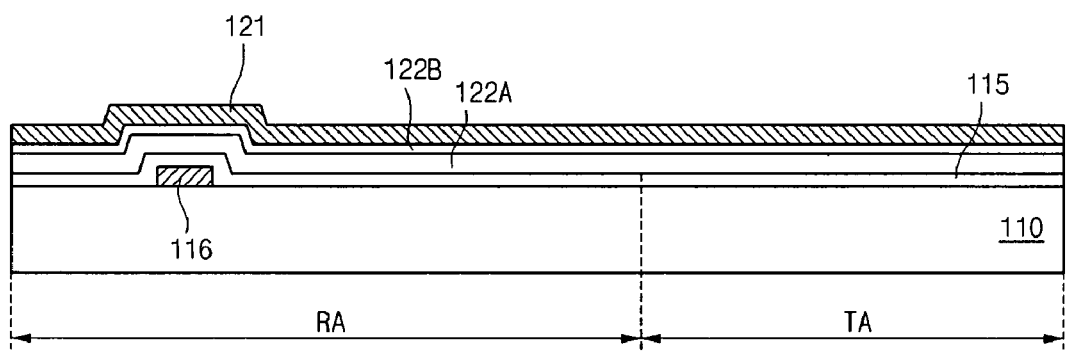
Figure 6C:
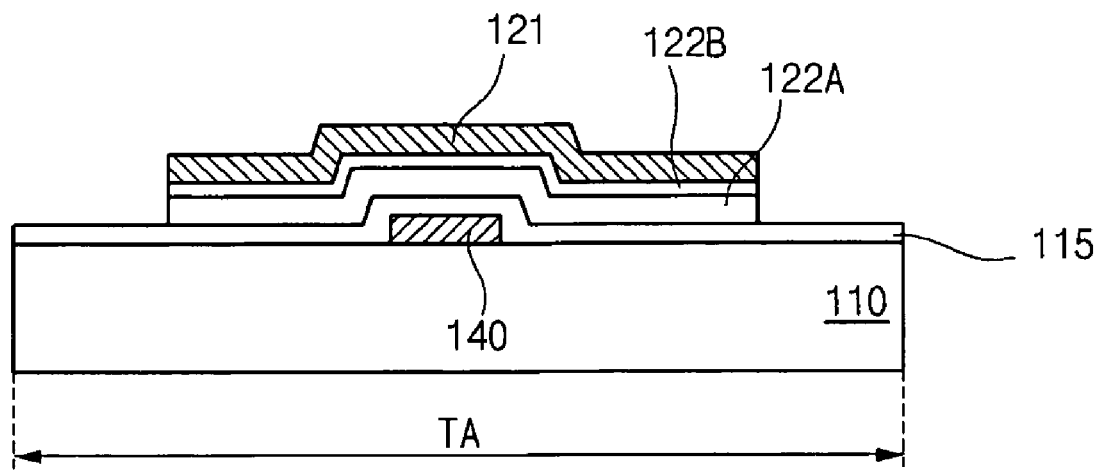

Next, as shown in FIG. 5C, a gate insulator 115, an intrinsic amorphous silicon layer 122A, an impurity-doped amorphous layer 122B, and a second metal layer 121 are formed on the entire surface of the substrate 110 having the gate electrode 116, in turn. As shown in FIG. 6C, a gate insulator 1 1 5, an intrinsic amorphous silicon layer 122A, an impurity-doped amorphous layer 122B, and a second metal layer 121 are formed on the entire surface of the substrate 110 having the gate pad 140, in turn.

Figure 5D:
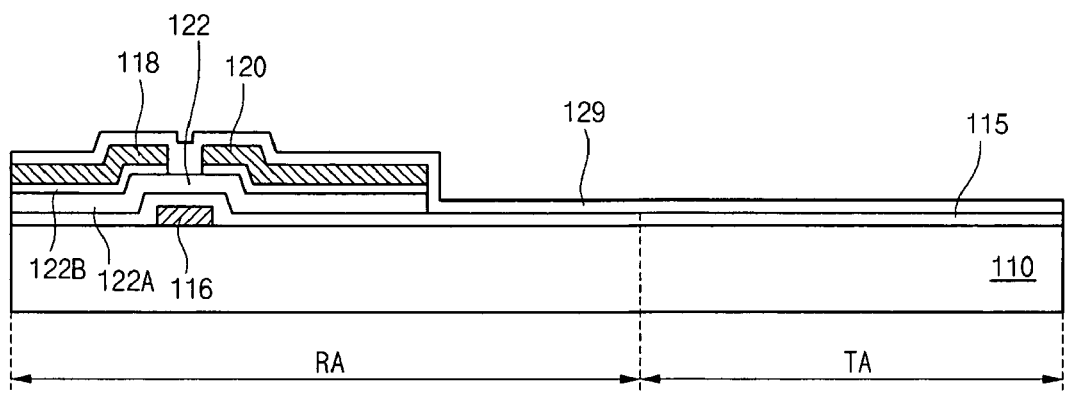
Figure 6D:
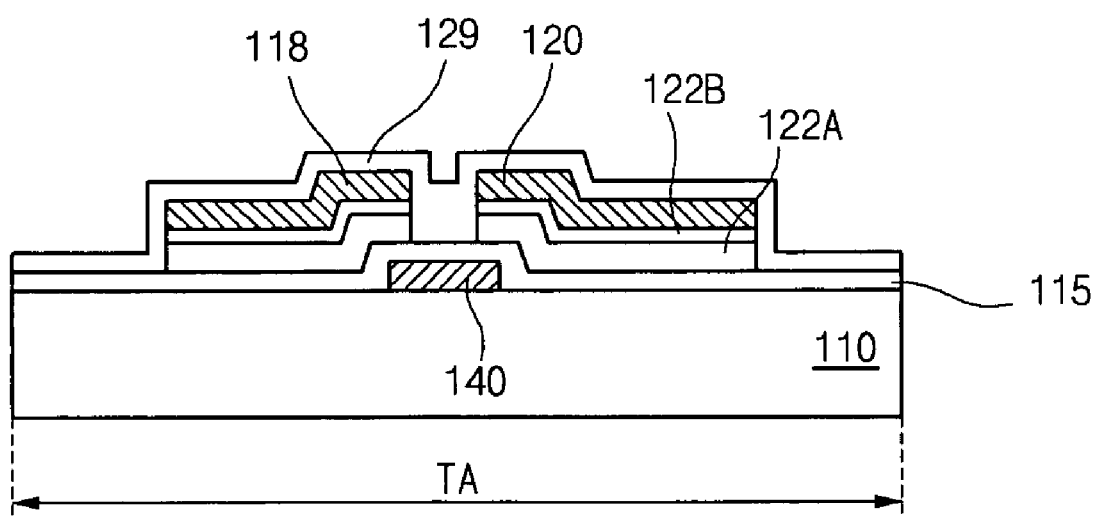

Next, as shown in FIG. 5D, by a second mask process, source and drain electrodes 118 and 120 and an active layer 122 are formed. The active layer 122 generally refers to the exposed portion of the intrinsic amorphous silicon layer 122A. In the pad region as shown in FIG. 6D, metal patterns 118 and 120 exposing a portion of the gate insulator 115 are formed. Though not shown in FIGS. 5D and 6D, the second mask process will be briefly explained. A PR layer is spread on the second metal layer 121, and then a mask having a transmission-zone, a barrier-zone and a semitransparent-zone is disposed on the substrate 110 having the PR layer. The semitransparent-zone of the mask corresponds to the gate electrode 116 and the gate pad 140, respectively, and the PR layer corresponding to the semitransparent-zone is exposed with only one portion. As the mask, a half-tone mask or a diffraction mask may be used. After etching the exposed second metal layer 121, the intrinsic amorphous silicon layer 122A, and the impurity-doped amorphous silicon layer 122B, the PR layer corresponding to the semitransparent-zone is eliminated by an ashing process. As a result, in the pixel region, source and drain electrodes 118 and 120 are formed by the second metal layer 121, and a portion of the impurity-doped amorphous silicon layer 122B is etched away to expose a portion of the intrinsic amorphous silicon layer 122A, thereby forming the active layer 122. A first passivation layer 129 is then disposed on the source and drain electrodes 118 and 120 and the exposed active layer 122.

Figure 1:
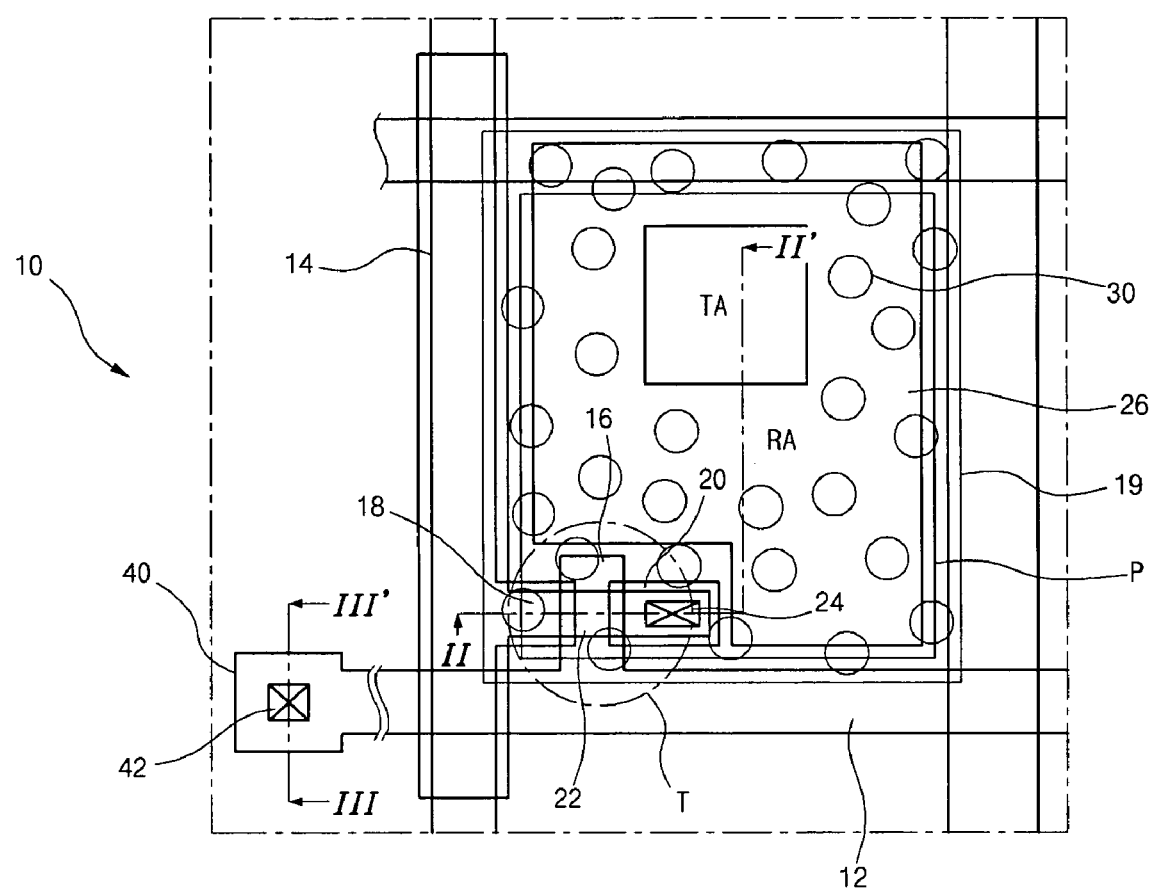
FIG. 1 is a plan view illustrating an array substrate for a transflective liquid crystal display device according to a related art.
Figure 2A:
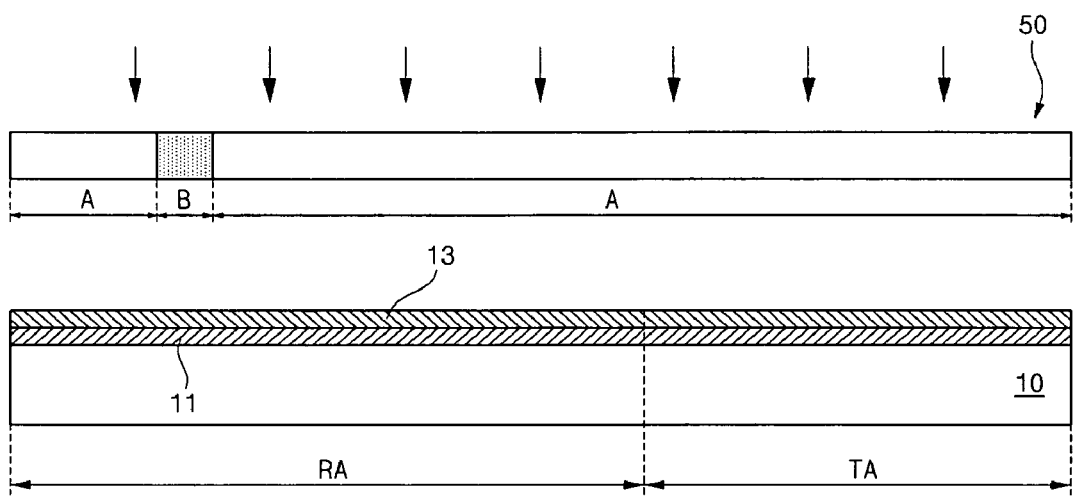
FIGS. 2A to 2H are cross-sectional views cutting along line II-II' of FIG. 1 and illustrating a process of forming of an array substrate for a transflective liquid crystal display device according to the related art.
Figure 2B:
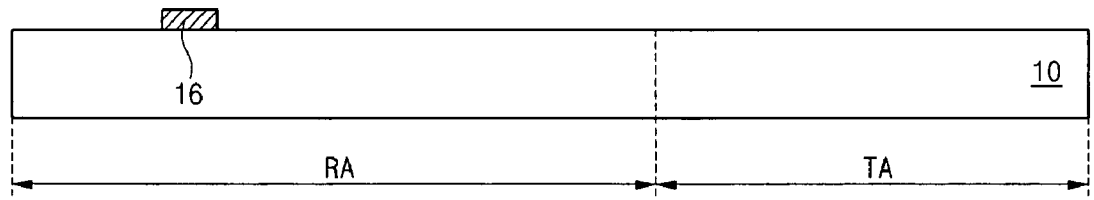
Figure 2C:
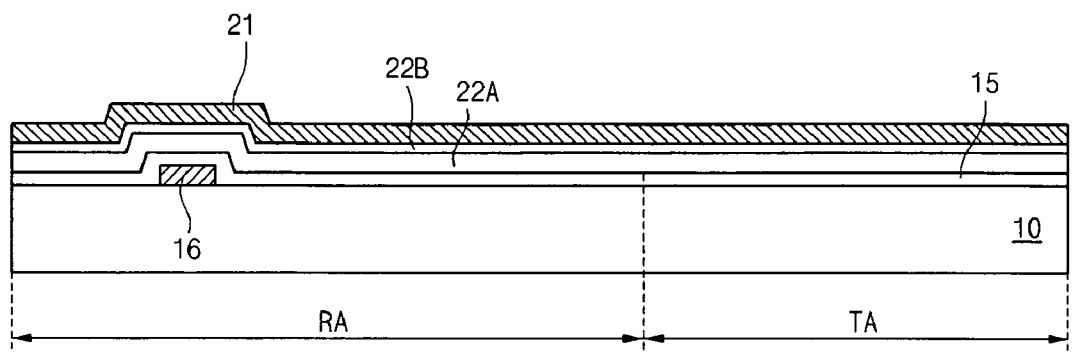
Figure 2D:
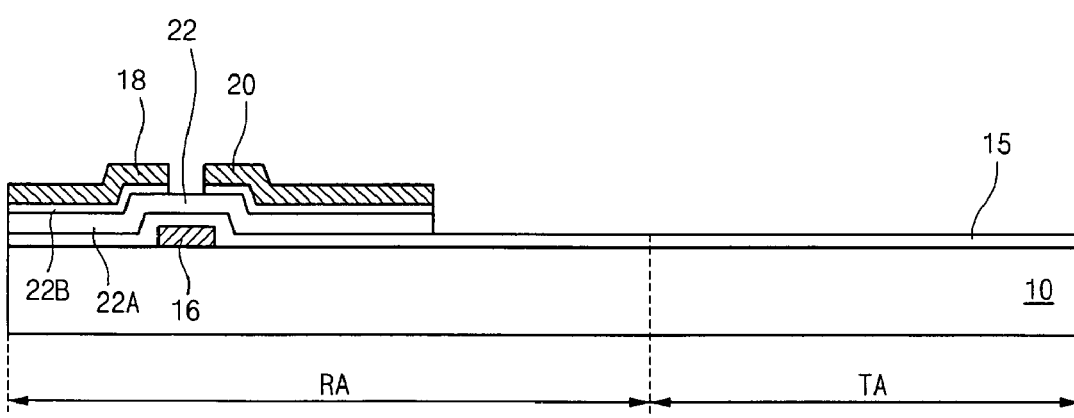
Figure 2E:
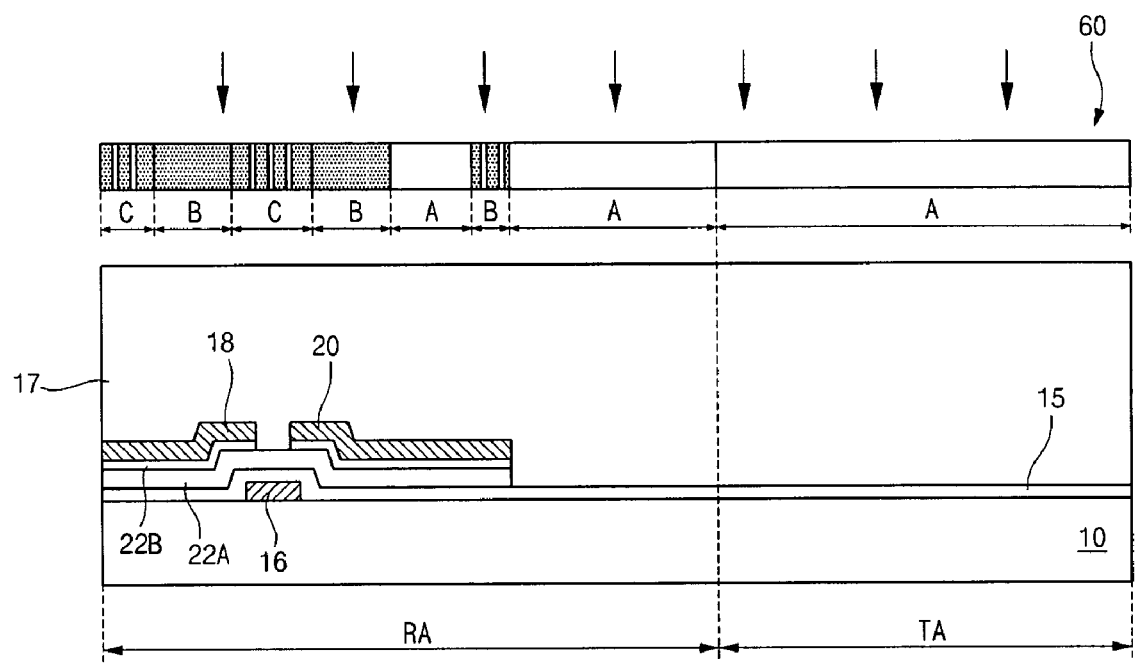
Figure 2F:
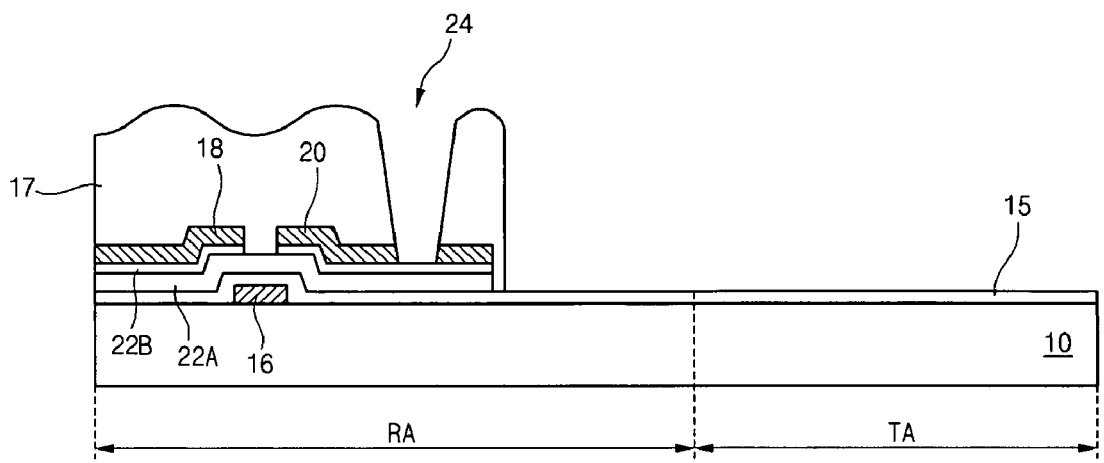
Figure 2G:
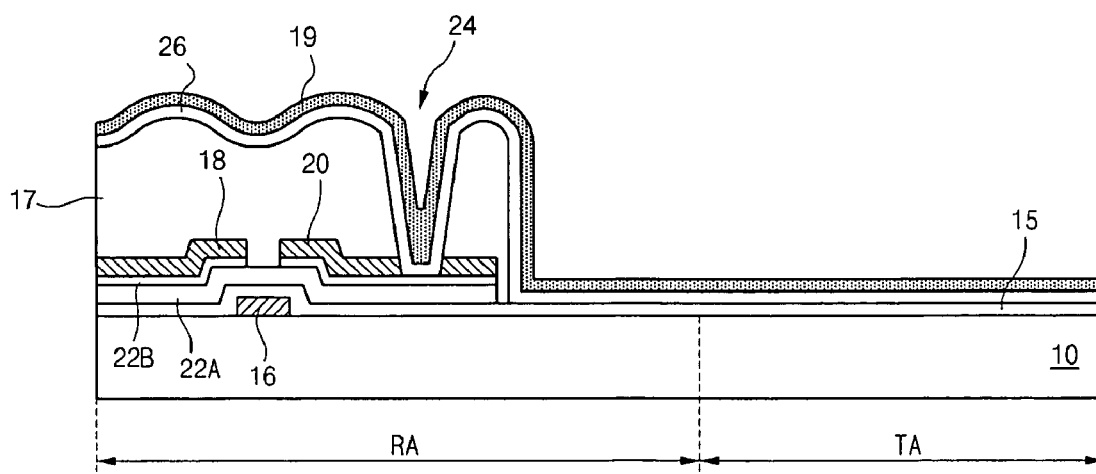
Figure 2H:
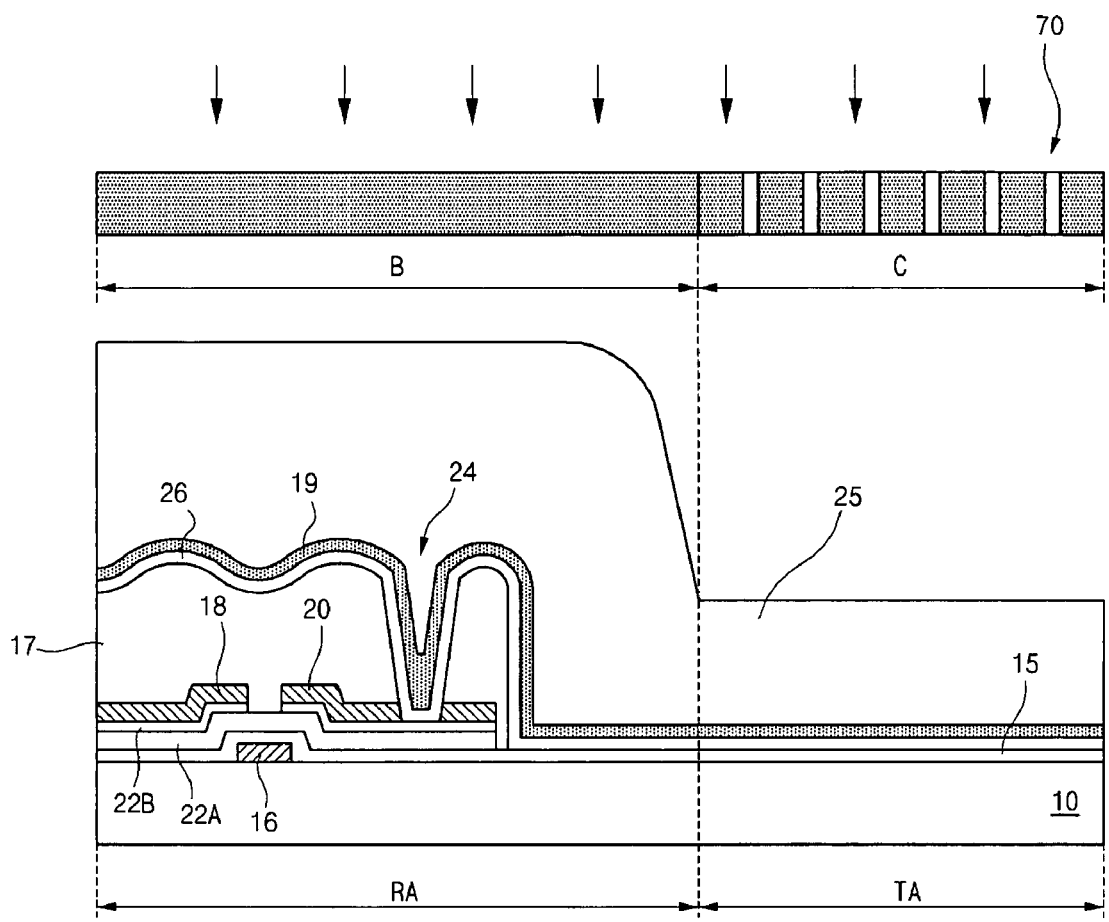
Figure 3A:
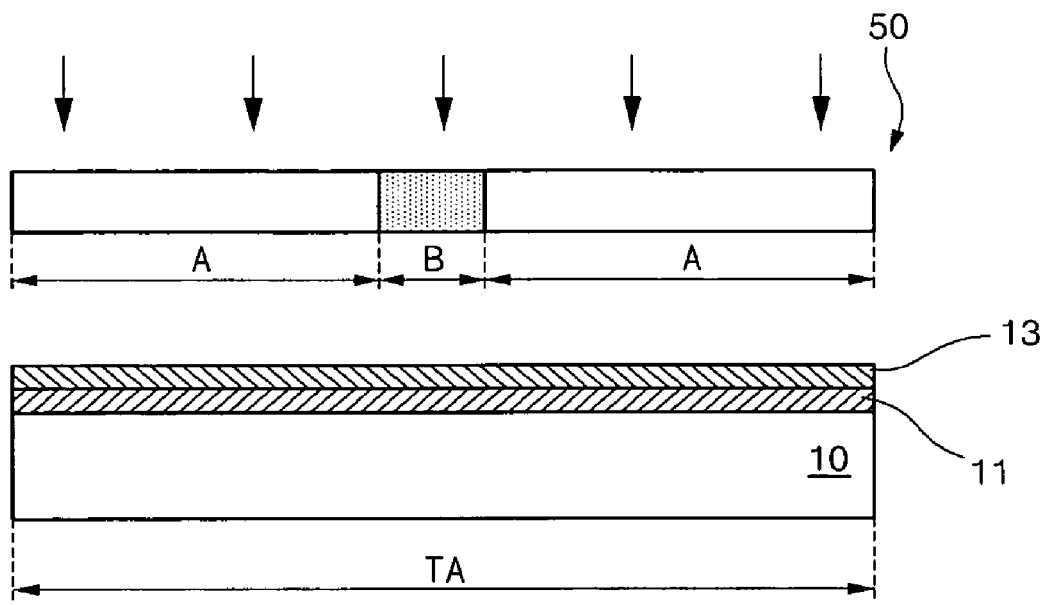
FIGS. 3A to 3H are cross-sectional views cutting along line III-III' of FIG. 1 and illustrating a process of forming of an array substrate for a transflective liquid crystal display device according to the related art.
Figure 3B:
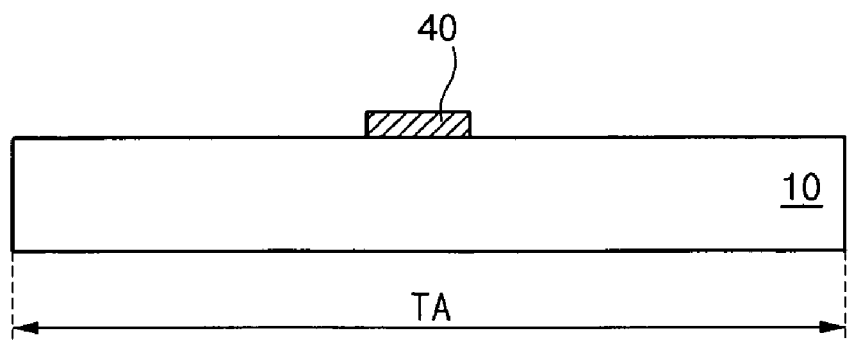
Figure 3C:
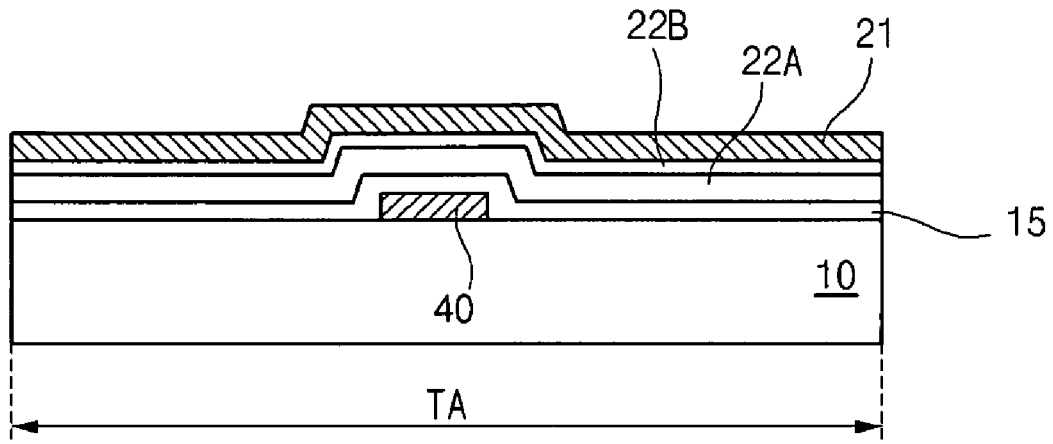
Figure 3D:
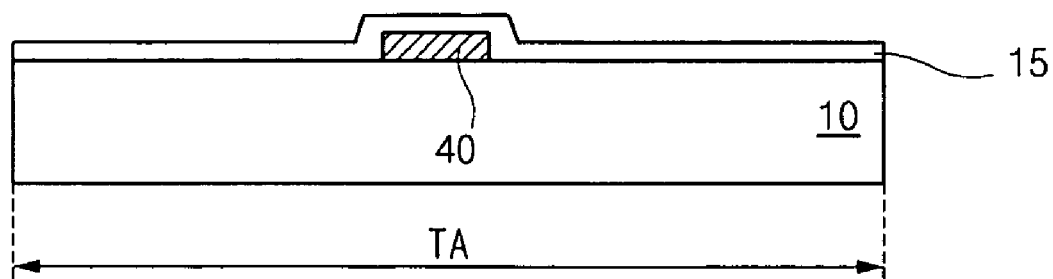

At this stage, in the pad region of the array substrate for the transflective liquid crystal display device using the four mask process according to the related art, the gate insulator 15 is only remained, and the active layer 22 and the metal layer 21 all are eliminated as shown in FIG. 3D. In contrast, the pad region of the array substrate for the transflective liquid crystal display device using the four mask process according to a first exemplary embodiment of the present invention has the same structure as a channel region of a thin film transistor a shown in FIG. 6D.

Figure 5E:
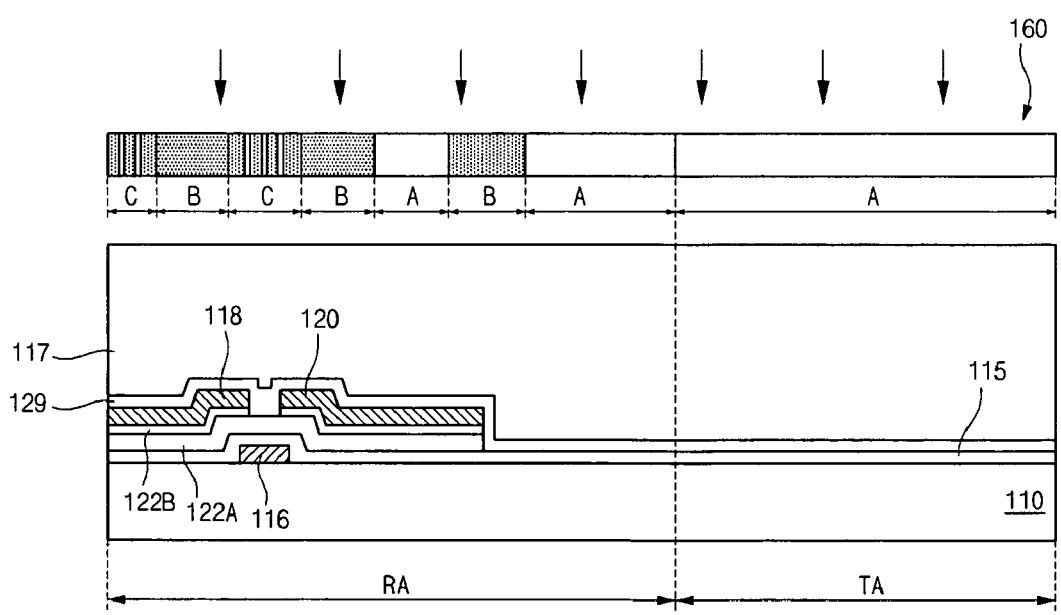
Figure 6E:
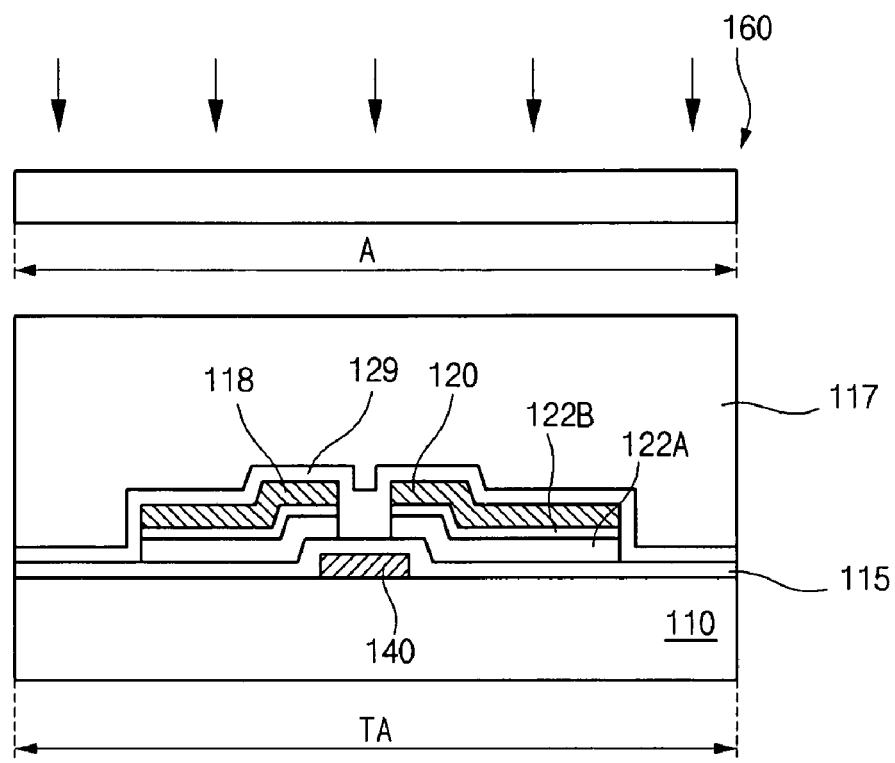

Next, as shown in FIG. 5E and FIG. 6E, a second passivation layer 117 is disposed by spreading one of transparent organic insulating materials such as benzocyclobutene (BCB) and acryl group resin on the first passivation layer 129.

Next, a third mask using a half-tone mask or a diffraction mask is used. As shown in FIG. 5E, a mask 160 having a transmission-zone A, a barrier-zone B and semitransparent-zone C is disposed on the substrate 110 having the second passivation layer 117. In the pad region, as shown in FIG. 6E, a mask 160 having a transmission-zone A is disposed on the substrate 110 having the second passivation layer 117. The second passivation layer 117 is a positive type where a part receiving a light is exposed and developed. As shown in FIG. 5E, the barrier-zone B and the semitransparent-zone C are alternatingly disposed corresponding to the reflection area RA in order to form an embossing pattern, and the transmission-zone A is disposed corresponding to the drain electrode 120 in order to form a drain contact hole (124 in FIG. 5F).

Figure 5F:
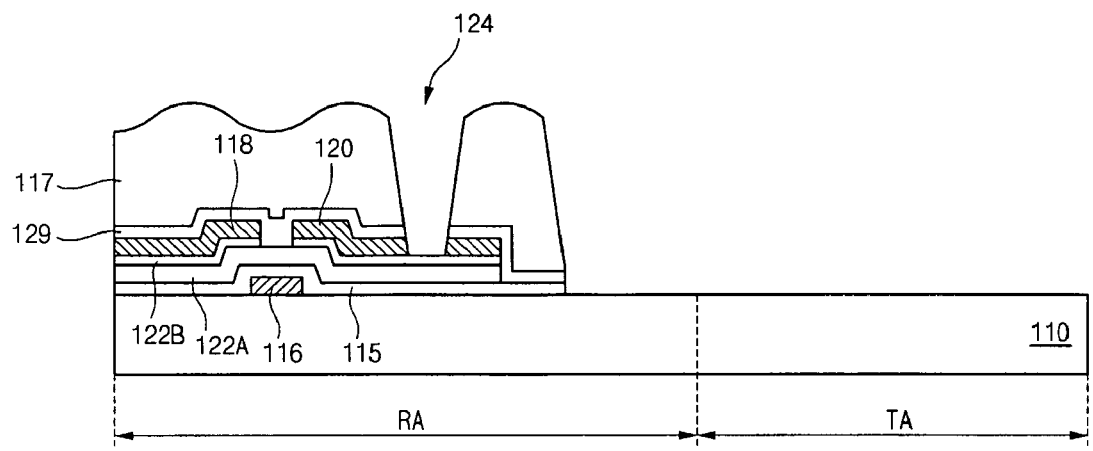
Figure 6F:
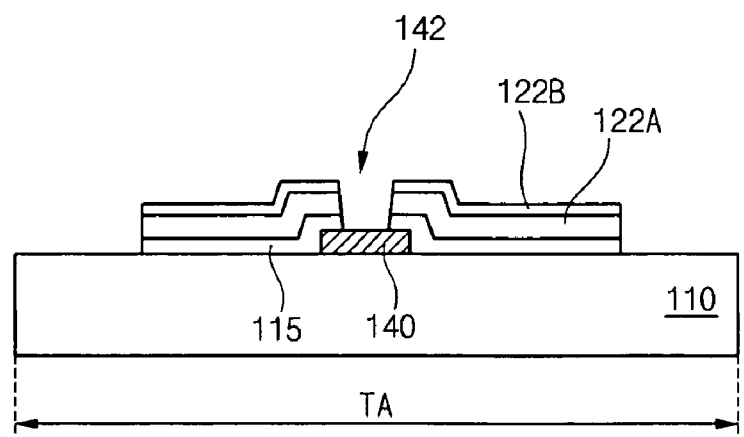

Next, after an exposing process, a developing process and a heat treatment are processed, an embossing-patterned second passivation layer 117 and a drain contact hole 124 exposing a portion of the impurity-doped amorphous silicon layer 122B are formed as shown in FIG. 5F. In addition, as shown in FIG. 6F, the second passivation layer 117 is completely eliminated and the first passivation layer 129 and the metal patterns 118 and 120 are eliminated by etching, and a gate pad contact hole 142 exposing a portion of the gate pad 140 is formed.

Figure 5G:
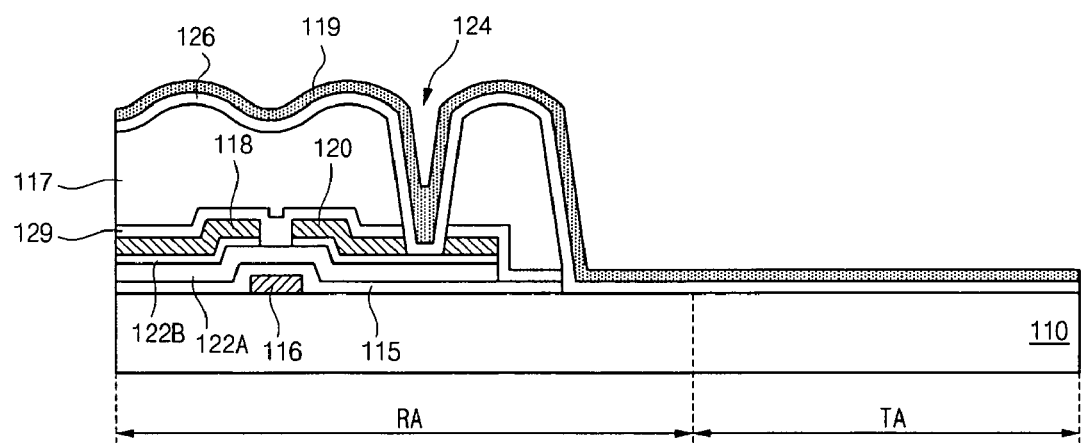
Figure 6G:
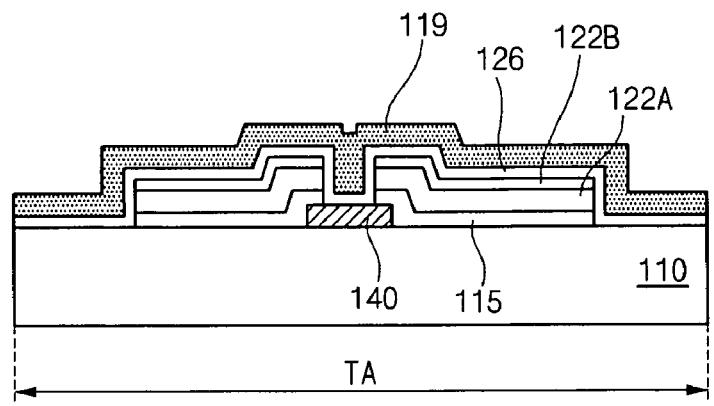

Next, as shown in FIG. 5G, a transparent conductive material 126 and a reflection layer 119 are formed on the embossing-patterned second passivation layer 117 and the gate insulator 115 exposed in the transmission area TA, in turn. The transparent conductive material 126 may be an indium-tin-oxide (ITO), an indium-zinc-oxide (IZO), or other suitable material. In this example, the indium-tin-oxide (ITO) is used. The indium-tin-oxide (ITO) 126 and the reflection layer 119 are disposed according to the shape of the embossing-patterned second passivation layer 117. In the pad region, as shown in FIG. 6G, an indium-tin-oxide (ITO) 126 and a reflection layer 119 are disposed on the exposed gate pad 140, in turn.

Figure 5H:
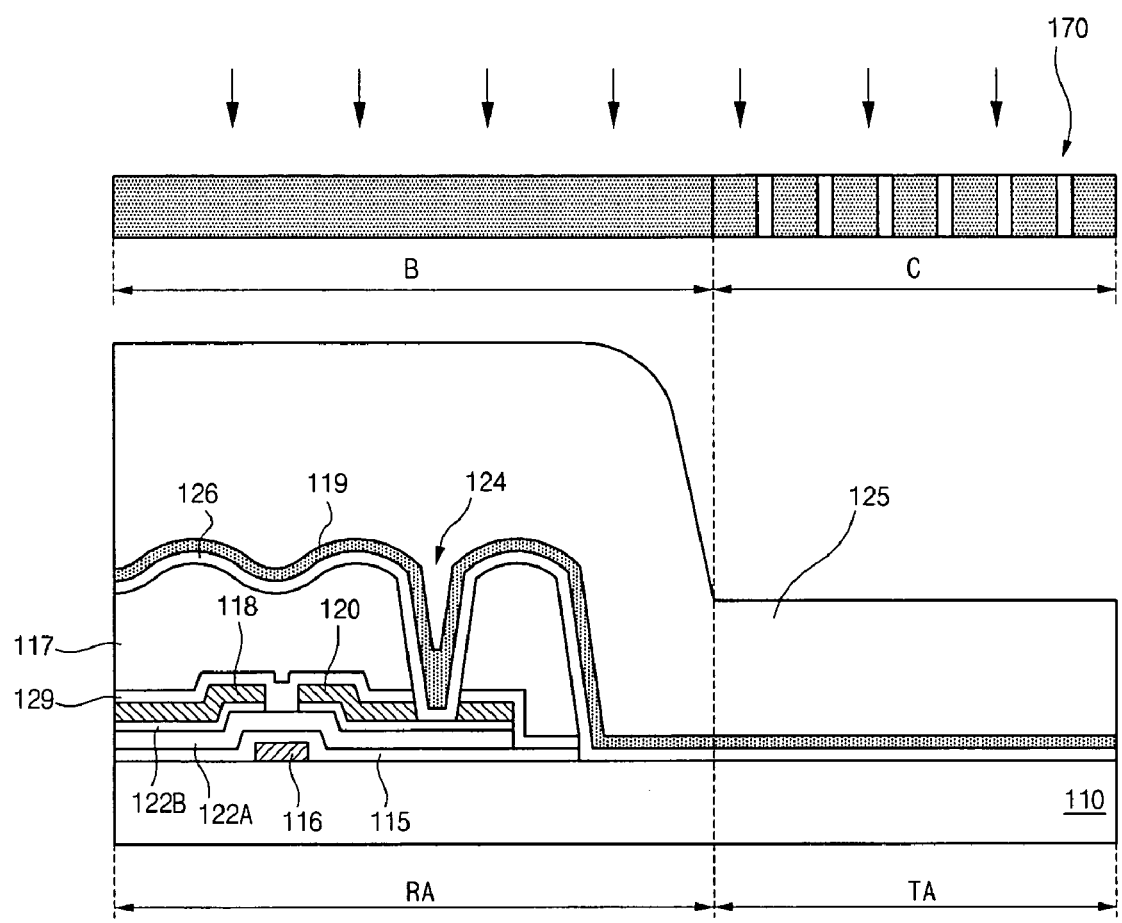

Next, a fourth mask using a half-tone mask or a diffraction mask is used. As shown in FIG. 5H, a PR layer 125 of a positive type is spread on the reflection layer 119, and then a half-tone mask 170 having a barrier-zone B corresponding to the reflection area RA and a semitransparent-zone C corresponding to the transmission area TA is disposed on the substrate 110 having the PR layer 125. As a result, the PR layer 125 having a height (thickness) that is ½ height of the PR layer 125 in the reflection area RA is formed in the transmission area TA. The PR layer 125 here is referred to as a half PR.

Figure 6H:
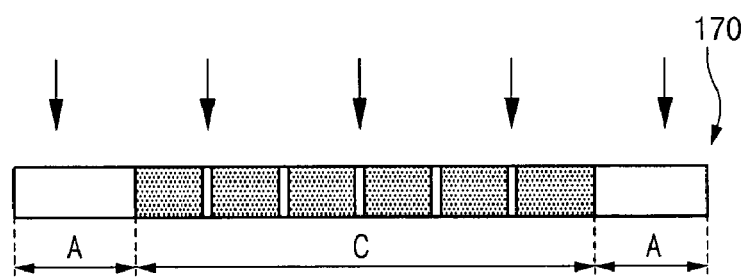
Figure 6H:
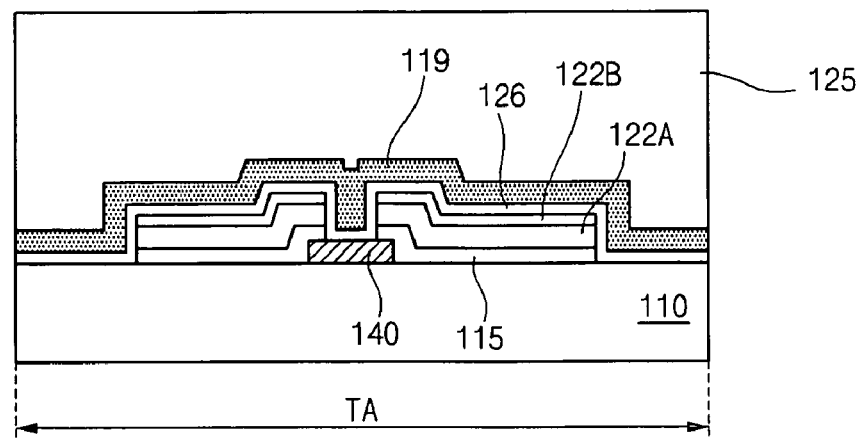

In the pad region, as shown in FIG. 6H, a PR layer 125 is spread on the reflection layer 119, and a half-tone mask 170 having a transmission-zone A and a semitransparent-zone C is disposed. At this point, the PR layer 125 in the pad region of FIG. 6H has the same height as the PR layer 125 in the transmission area TA of FIG. 5H. In other words, the PR layer 125 in the pad region as shown in FIG. 6H has a height equal to ½ height of the PR layer 125 in the reflection area RA of FIG. 5H. Since the second passivation layer 117 is not present in the pad region of FIG. 6H, a low step is formed and thus, the half PR can now be formed.

Figure 5I:
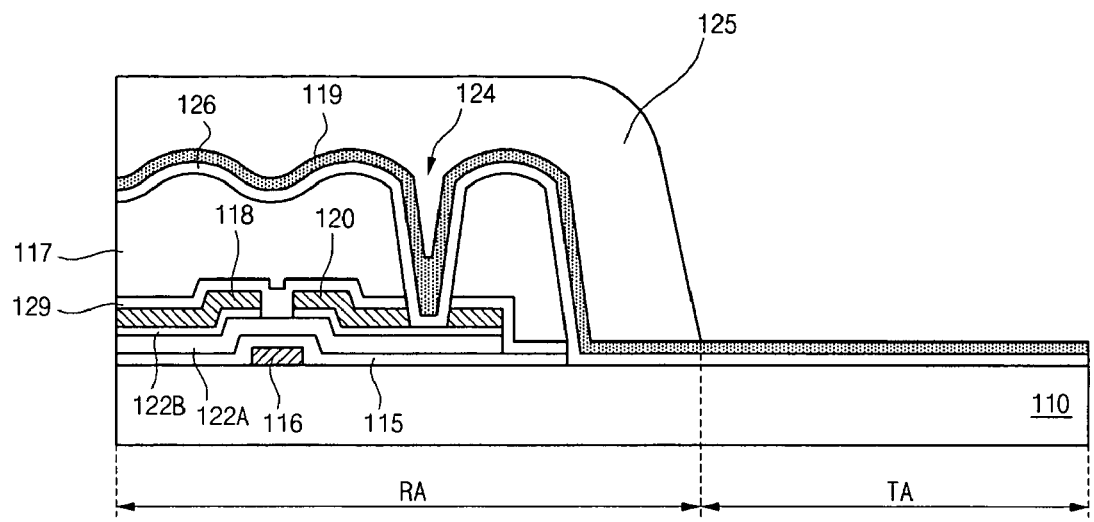
Figure 6I:
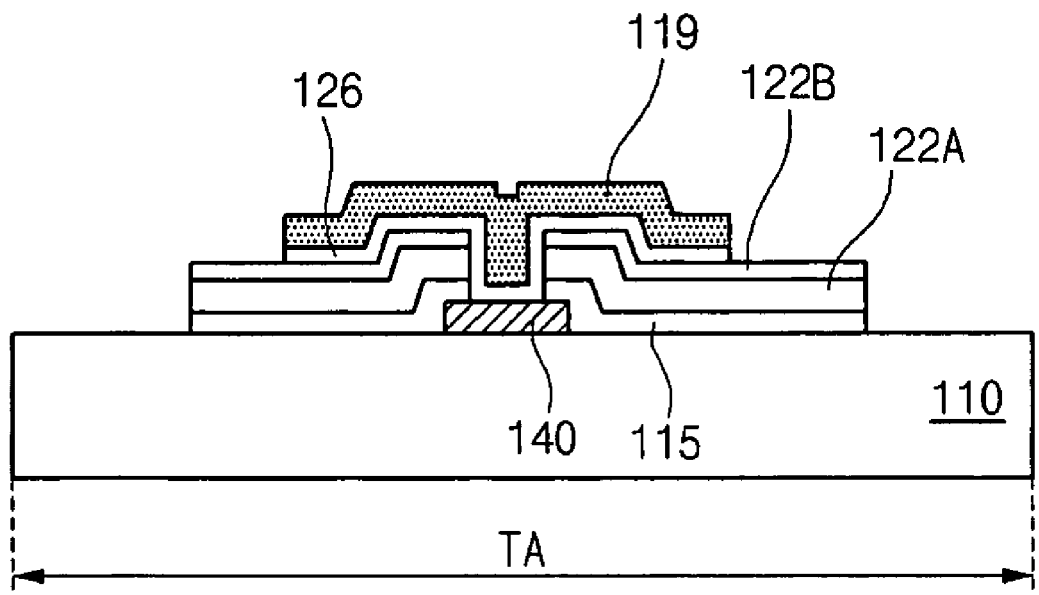

Next, the PR layer 125 is eliminated with the same ratio during an ashing process. As a result, as shown in FIG. 5I, all the PR layer 125 is eliminated in the transmission area TA, while the PR layer 125 remains in the reflection area RA. As shown in FIG. 6I, all the PR layer 125 is eliminated in the pad region.

Figure 5J:
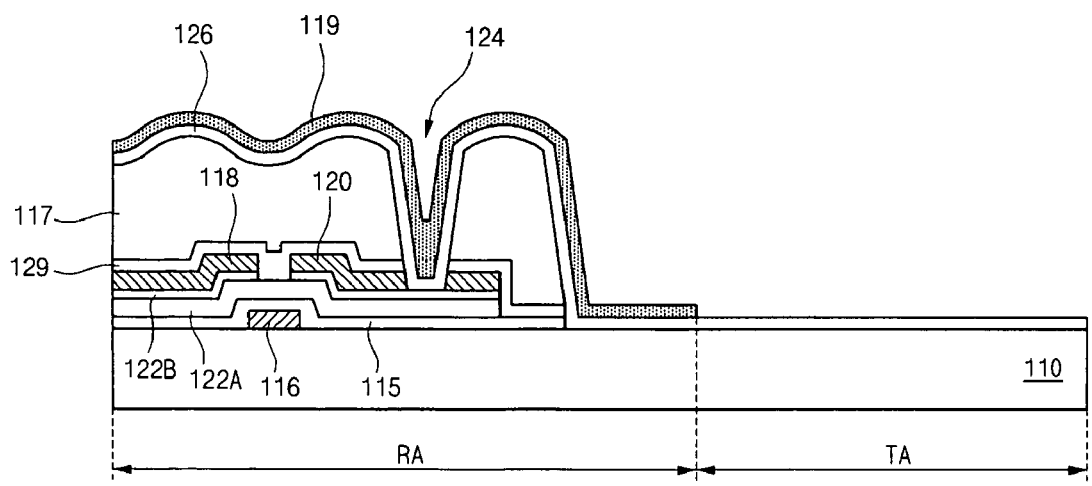
Figure 6J:
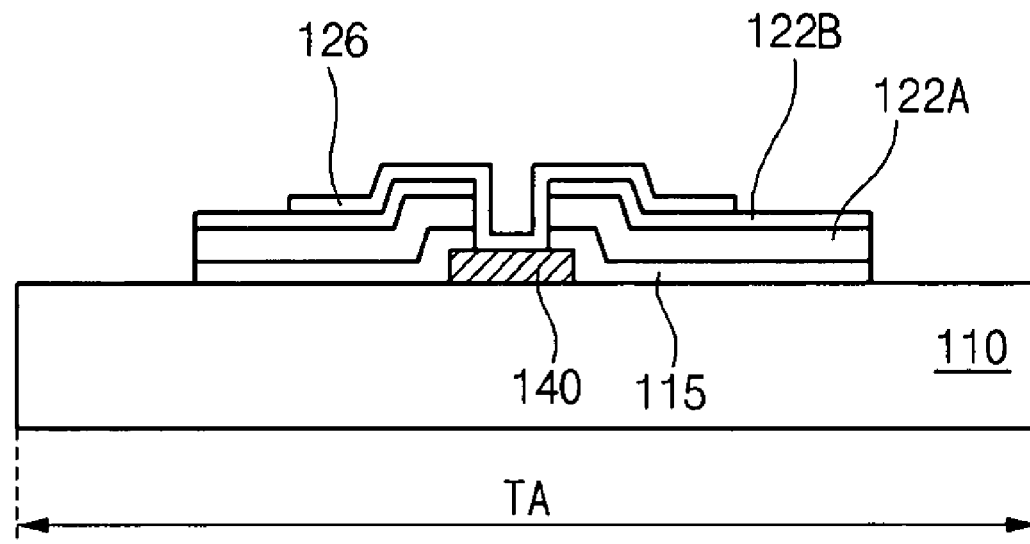

Next, as shown in FIG. 5J, the reflection plate 119 exposed in the transmission area TA is etched (using the PR layer 125 as a mask), and then the remaining PR layer 125 in the reflection are RA in the reflection area RA is eliminated by an ashing process. As shown in FIG. 6J, in the pad region, the exposed reflection plate 119 is removed. Accordingly, the pad region of the array substrate for the transflective liquid crystal display device according to the first exemplary embodiment of the present invention is completed.

As a result, in the first exemplary embodiment of the present invention, in the pad region such as the gate pad region, an active layer instead of a passivation layer is disposed, and a low step is formed, thereby allowing a formation of a half PR. For instance, the active layer (the intrinsic amorphous silicon layer 122A) is disposed directly on the gate insulator 115 in the pad region as shown in FIG. 6J.

Accordingly, the array substrate for the transflective liquid crystal display device with the four mask process can be effectively completed using the half PR.

Now, a second exemplary embodiment of the present invention will be explained referring to FIGS. 7A-7J. Since the process of forming a thin film transistor region for the first and second exemplary embodiments is the same, the explanation of the formation of the thin film transistor region in the second exemplary embodiment of the present invention will be made referring to FIGS. 5A to 5J already discussed above in connection with the first embodiment.

FIGS. 5A to 5J are cross-sectional views cutting along line V-V' of FIG. 4 and illustrating a process of forming of an array substrate for a transflective liquid crystal display device according to the present invention. FIGS. 7A to 7J are cross-sectional views cutting along line VI-VI' of FIG. 4 and illustrating a process of forming of an array substrate for a transflective liquid crystal display device according to the second exemplary embodiment of the present invention.

Figure 7A:
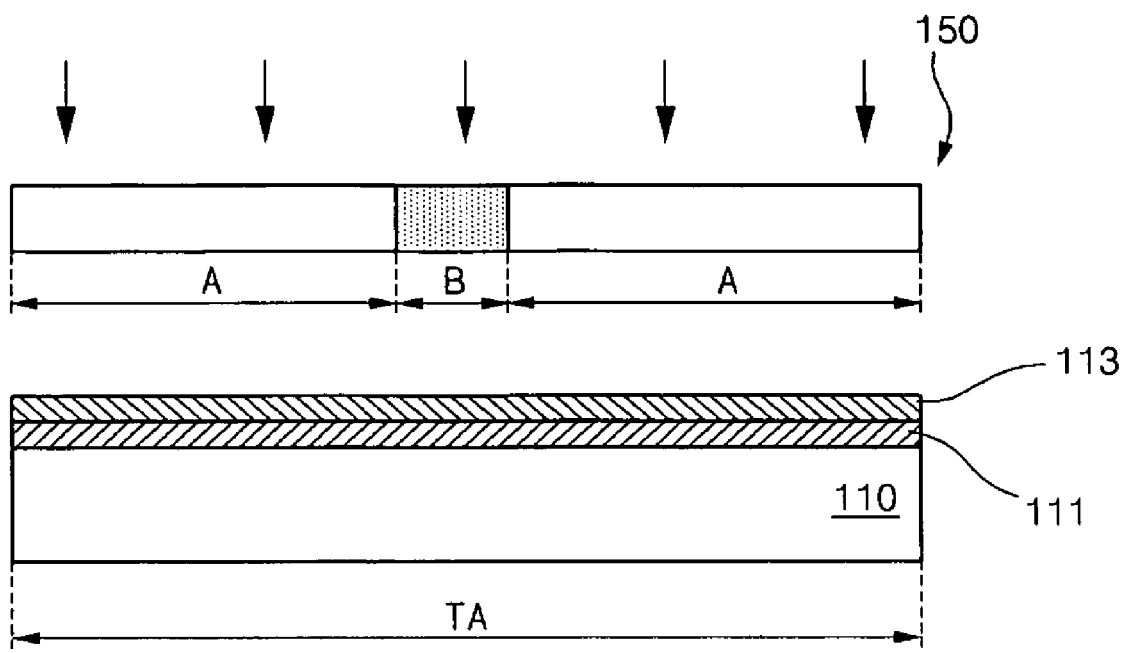
FIGS. 7A to 7J are cross-sectional views cutting along line VI-VI' of FIG. 4 and illustrating a process of forming of an array substrate for a transflecfive liquid crystal display device according to a second exemplary embodiment of the present invention.
Figure 7B:
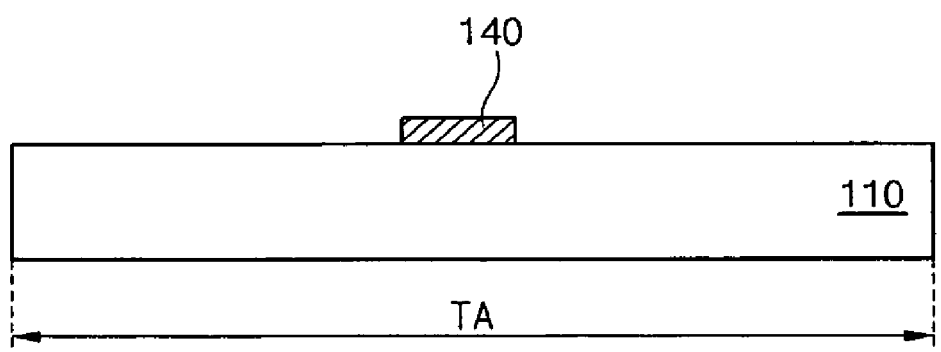

As shown in FIG. 5A and FIG. 7A, a first metal layer 111 is formed on a transparent substrate 110. Then, as a first mask process, a PR layer 113 of a positive type is spread on the first metal layer 111, and a mask 150 having a transmission-zone A and a barrier-zone B is disposed on the substrate 110 having the PR layer 113. Then, the first metal layer 111 exposed by an exposing process and a developing process is etched, and then the remaining PR layer 113 is eliminated by an ashing process. As a result, the gate electrode 116 is formed in the reflection area RA of the substrate 110 as shown in FIG. 5B, and the gate pad 140 is formed in the transmission area TA of the substrate 110 as shown in FIG. 7B.

Figure 7C:
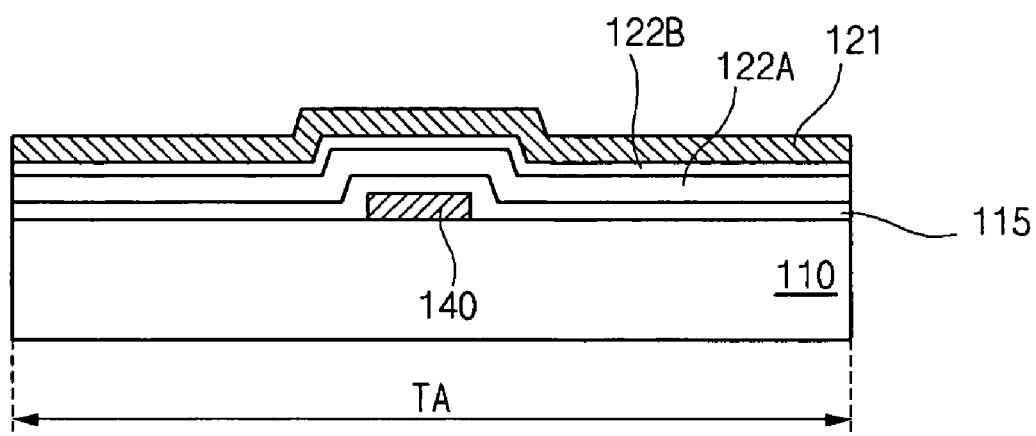

Next, as shown in FIG. 5C, a gate insulator 115, an intrinsic amorphous silicon layer 122A, an impurity-doped amorphous layer 122B, and a second metal layer 121 are formed on the entire surface of the substrate 110 having the gate electrode 116, in turn. As shown in FIG. 7C, a gate insulator 115, an intrinsic amorphous silicon layer 122A, an impurity-doped amorphous layer 122B, and a second metal layer 121 are formed on the entire surface of the substrate 110 having the gate pad 140, in turn.

Figure 7D:
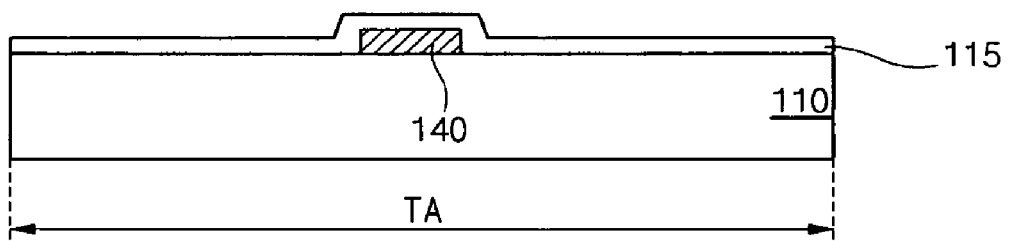

Next, as shown in FIG. 5D, by a second mask process using a half-tone mask or a diffraction mask, source and drain electrodes 118 and 120 and an active layer 122 are formed. The active layer 122 generally refers to the exposed portion of the intrinsic amorphous silicon layer 122A. Then, a first passivation layer 129 is disposed on the source and drain electrodes 118 and 120 and the exposed active layer 122. In the pad region, after a mask having a transmission-zone is disposed and exposing, developing, etching and ashing processes are performed, as shown in FIG. 7D, the gate insulator 115 remains.

Figure 7E:
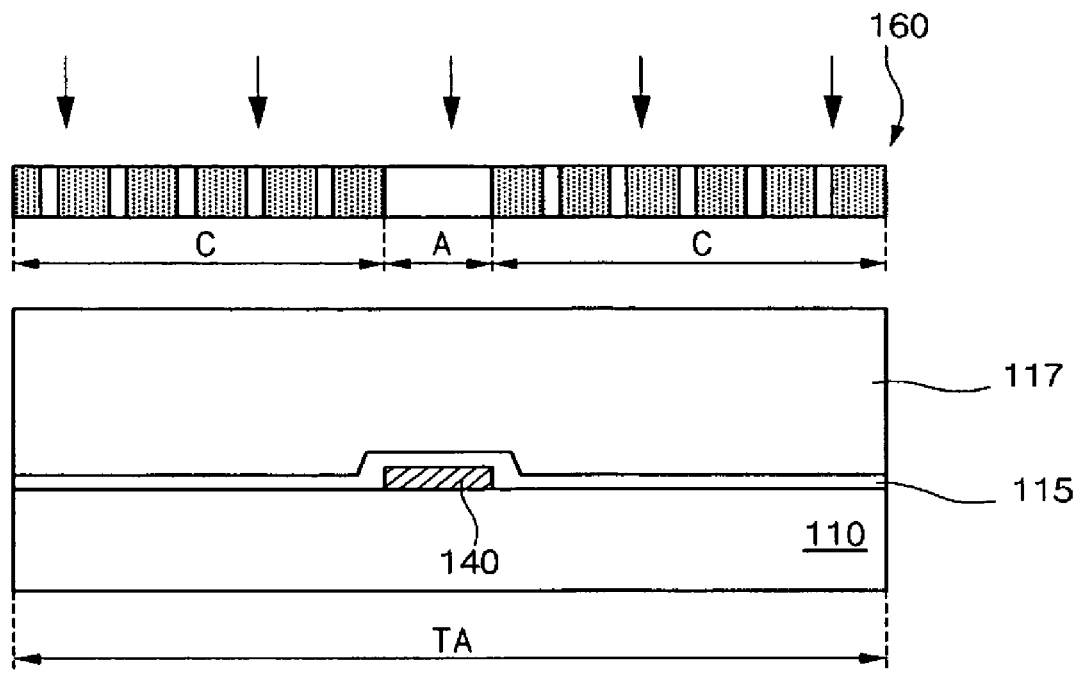

Next, as shown in FIG. 5E and FIG. 7E, a second passivation layer 117 is disposed by spreading one of transparent organic insulating materials such as benzocyclobutene (BCB) and acryl group resin on the first passivation layer 129 and the gate insulator 115, respectively.

Next, a third mask using a half-tone mask or a diffraction mask is used. As shown in FIG. 5E, a mask 160 having a transmission-zone A, a barrier-zone B and semitransparent-zone C is disposed on the substrate 110 having the second passivation layer 117. In the pad region, as shown in FIG. 7E, a mask 160 having a transmission-zone A and a semitransparent-zone C is disposed on the substrate 110 having the second passivation layer 117. The second passivation layer 117 is a positive type where a part receiving a light is exposed and developed. As shown in FIG. 5E, the barrier-zone B and the semitransparent-zone C are alternatingly disposed corresponding to the reflection area RA in order to form an embossing pattern, and the transmission-zone A is disposed corresponding to the drain electrode 120 in order to form a drain contact hole (124 in FIG. 5F).

Figure 3E:
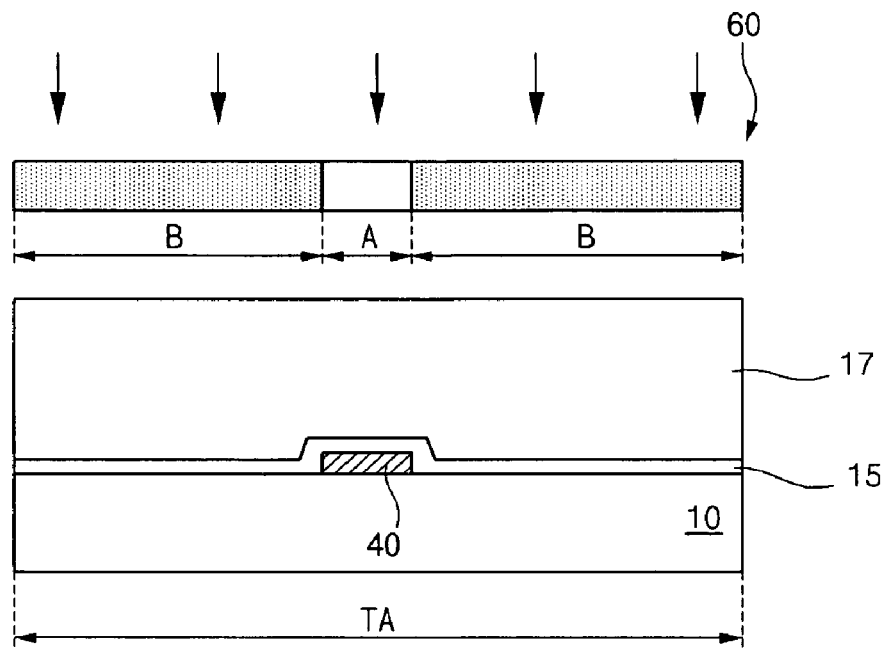
Figure 3F:
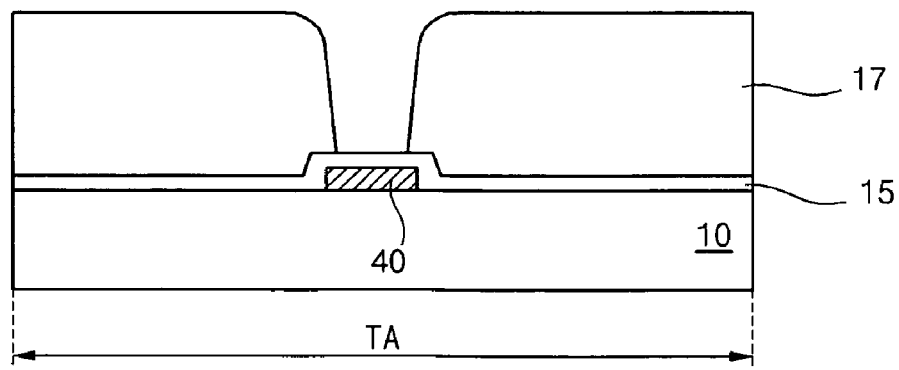
Figure 3G:
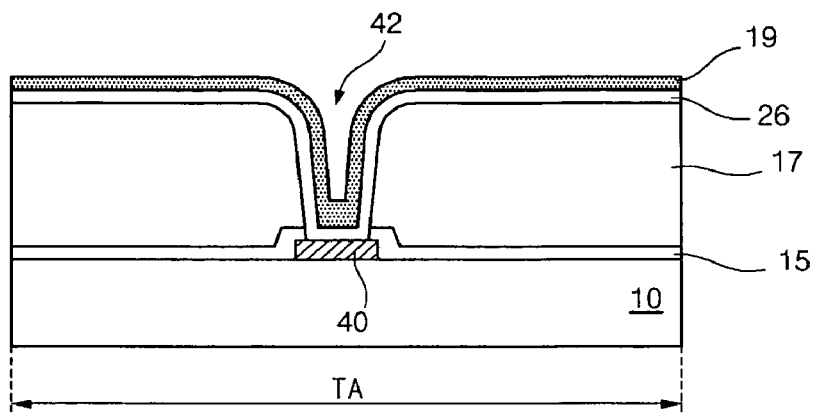
Figure 3H:
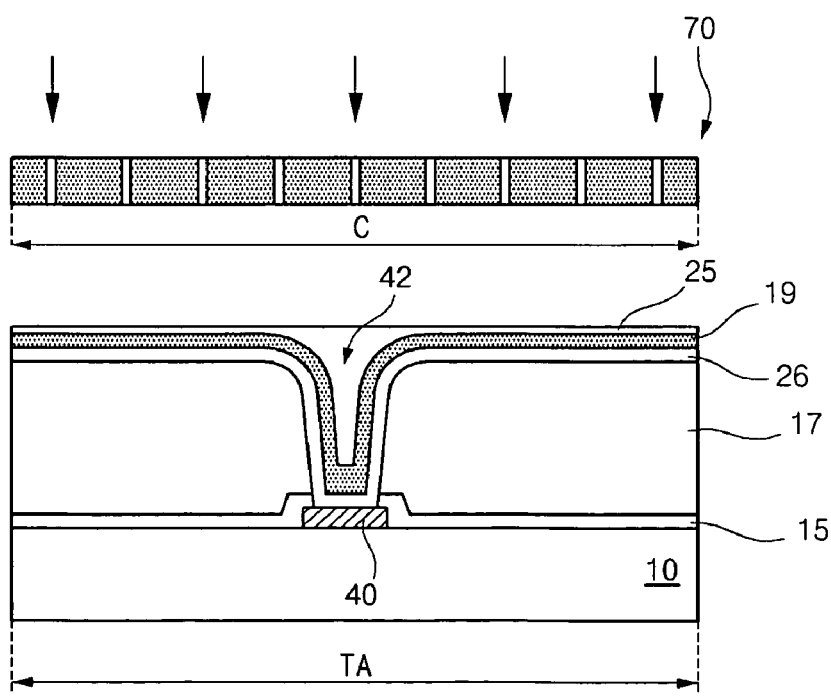
Figure 7F:
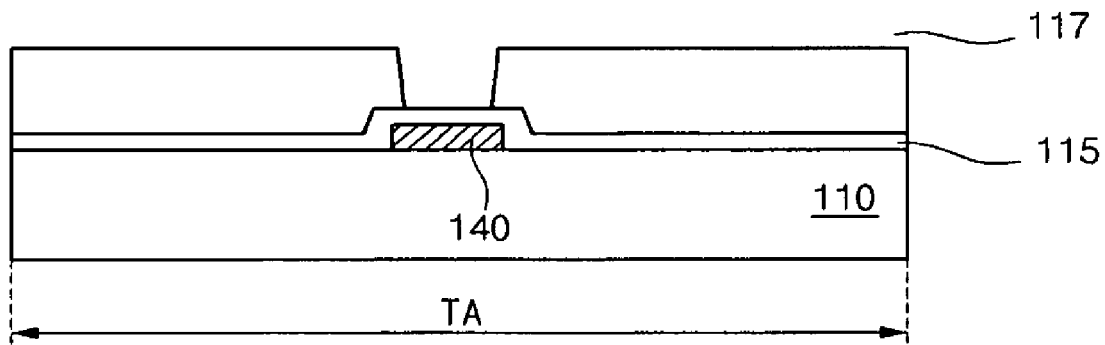

Next, after an exposing process, a developing process and a heat treatment are processed, an embossing-patterned second passivation layer 117 and a drain contact hole 124 exposing a portion of the impurity-doped amorphous silicon layer 122B are formed as shown in FIG. 5F. In addition, as shown in FIG. 7F, a patterned second passivation layer 117 exposing a portion of the gate insulator 115 corresponding to the gate pad 140 is formed. At this stage, because of the mask 160 having the semitransparent zone C (not B), the thickness of the patterned second passivation layer 117 is low compared to that of the layer 17 in FIG. 3E of the related art, thereby a low step is formed. Then in the pad region, the portion of the gate insulator 115 exposed through an opening in the second passivation layer 117 is etched and then the second passivation layer 117 is completely removed using known techniques.

Figure 7G:
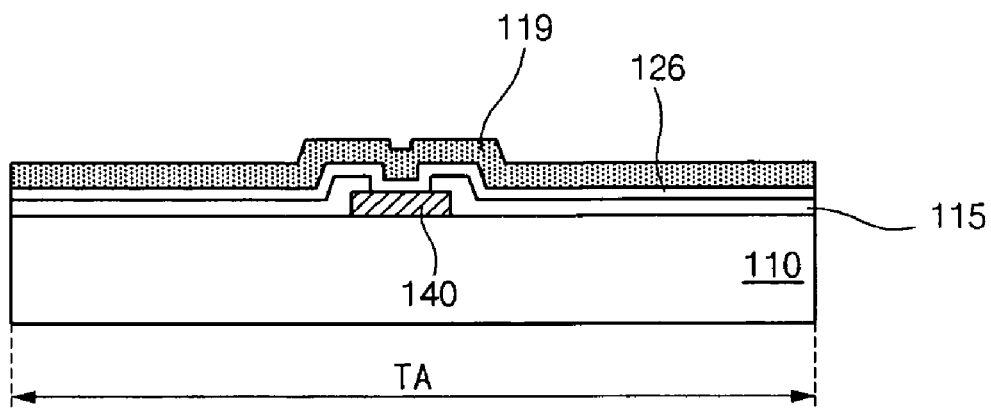

Next, as shown in FIG. 5G, a transparent conductive material 126 and a reflection layer 119 are formed on the embossing-patterned second passivation layer 117 and the gate insulator 115 exposed in the transmission area TA, in turn. The transparent conductive material 126 may be an indium-tin-oxide (ITO), an indium-zinc-oxide (IZO), or other suitable material. In this example, the indium-tin-oxide (ITO) is used. The indium-tin-oxide (ITO) 126 and the reflection layer 119 are disposed according to the shape of the embossing-patterned second passivation layer 117. As shown in FIG. 7G, an indium-tin-oxide (ITO) 126 and a reflection layer 119 are disposed on the gate insulator 115 and the exposed portion of the gate pad 140, in turn.

Next, a fourth mask using a half-tone mask or a diffraction mask is used. As shown in FIG. 5H, a PR layer 125 of a positive type is spread on the reflection layer 119, and then a half-tone mask 170 having a barrier-zone B corresponding to the reflection area RA and a semitransparent-zone C corresponding to the transmission area TA is disposed on the substrate 110 having the PR layer 125. As a result, the PR layer 125 having a height (thickness) that is ½ height of the PR layer 125 in the reflection area RA is formed in the transmission area TA. The PR layer 125 here is referred to as a half PR.

Figure 7H:
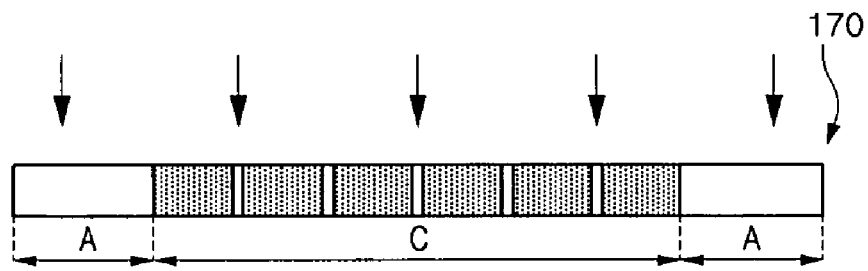
Figure 7H:
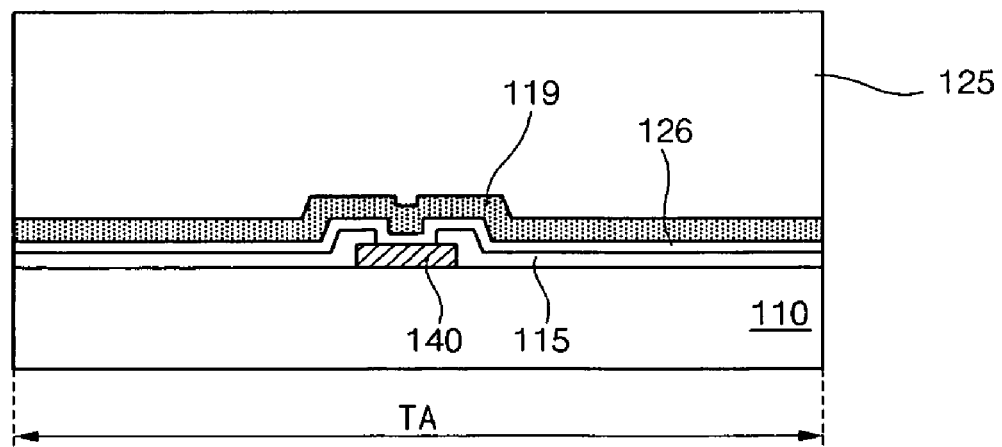

In the pad region, as shown in FIG. 7H, a PR layer 125 is spread on the reflection layer 119, and a half-tone mask 170 having a transmission-zone A and a semitransparent-zone C is disposed. The PR layer 125 in the pad region has the same height as the PR layer 125 in the transmission area TA of FIG. 5H. In other words, the PR layer 125 in the pad region has a height that is equal to ½ height of the PR layer 125 in the reflection area RA of FIG. 5H. Accordingly, the second passivation layer 117 is eliminated after all and thus the half PR can be formed in the pad region.

Figure 7I:
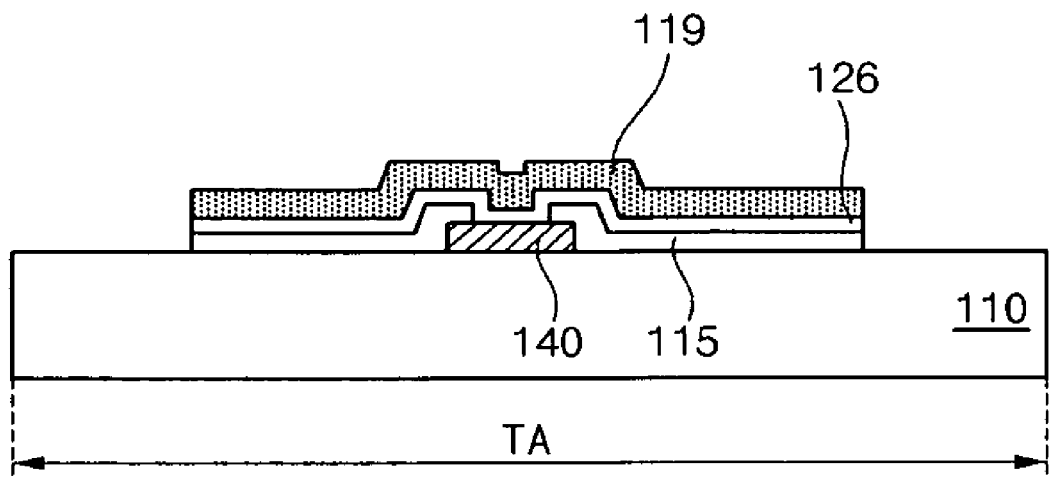

Next, the PR layer 125 is eliminated with the same ratio during an ashing process. As a result, as shown in FIG. 5I, all the PR layer 125 is eliminated in the transmission area TA, while the PR layer 125 remains in the reflection area RA. As shown in FIG. 7I, the PR layer 125 in the pad region is eliminated.

Figure 7J:
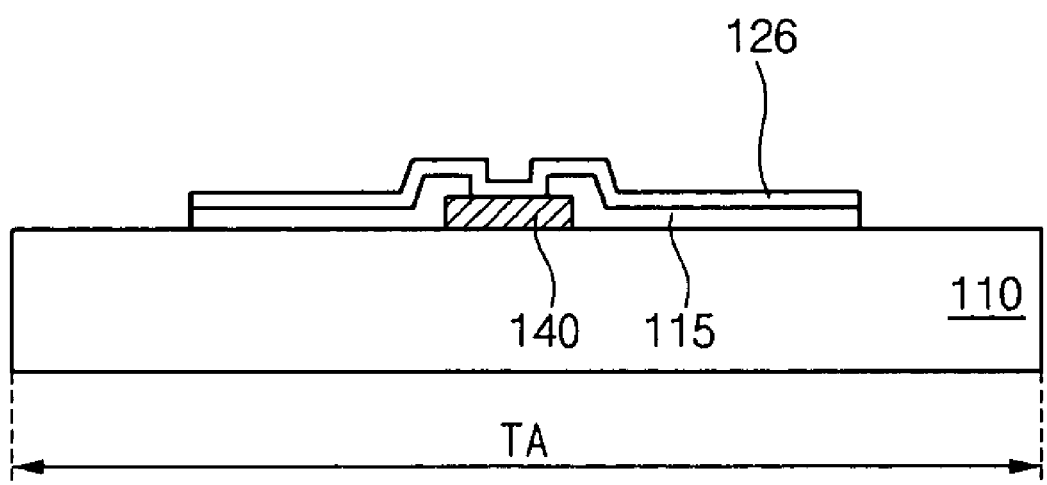

Next, as shown in FIG. 5J, the reflection plate 119 exposed in the transmission area TA is selectively etched, and then the remaining PR layer 125 is eliminated by an ashing process. As shown in FIG. 7J, the exposed reflection plate 119 is etched and removed. Accordingly, the pad region of the array substrate for the transflective liquid crystal display device according to the second exemplary embodiment of the present invention is completed.

In the second exemplary embodiment of the present invention, a thickness of a passivation layer in a pad region is reduced and thus, a low step is produced. Accordingly, the array substrate for the transflective liquid crystal display device with the four mask process can be effectively completed using the half PR.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A fabrication method of an array substrate for a transflective liquid crystal display device, the method comprising:
   forming a gate pad on a substrate through a first mask process;
   sequentially forming a gate insulator, an intrinsic amorphous silicon layer, an impurity-doped amorphous silicon layer and a metal layer on the gate pad;
   forming, in a pad region, a first auxiliary pad pattern having a first opening exposing a portion of the gate insulator, by selectively etching the metal layer, the impurity-doped amorphous silicon layer and the intrinsic amorphous silicon layer through a second mask process, the first auxiliary pad pattern including the intrinsic amorphous silicon layer; and
   forming a passivation layer on the first auxiliary pad pattern and the exposed the gate insulator.

2. The method according to claim 1, further comprising:
   forming a second auxiliary pad pattern having a second opening exposing a portion of the gate pad, by selectively etching the passivation layer, the metal layer, the impurity-doped amorphous silicon layer, the intrinsic amorphous silicon layer and the gate insulator corresponding to the gate pad through a third mask process; and
   sequentially forming a transparent conductive layer and a reflection layer on the exposed gate pad.

3. The method according to claim 2, further comprising:
   forming a gate pad terminal, by forming a half photoresist on the reflection layer and selectively etching the reflection layer and the transparent conductive layer through a fourth mask process; and then
   removing the reflection layer in the gate pad terminal.

4. The method according to claim 2, wherein the fourth mask process uses a mask having first and second zones, and a transmittance of the first zone is larger than a transmittance of the second zone.

5. The method according to claim 1, further comprising:
   defining a reflection region and a transmission region on the substrate;
   forming a gate electrode in the reflection region through the first mask process, wherein the gate insulator, the intrinsic amorphous silicon layer, the impurity-doped amorphous silicon layer, and the metal layer are also formed on the gate electrode, sequentially; and
   forming source and drain electrodes by selectively etching the metal layer, and an active layer by selectively etching the impurity-doped amorphous silicon layer between the source and drain electrodes through the second mask process.

6. The method according to claim 5, wherein the passivation layer is also formed on the source and drain electrodes and the active layer and has an embossed surface and a contact hole exposing a portion of the drain electrode through the third mask process, and the transparent conductive layer and the reflection layer are also formed on the passivation layer having the embossed surface and the exposed drain electrode, and wherein the method further comprises:
   forming a reflection plate, by forming a half photoresist on the reflection layer in the reflection region and selectively etching the reflection layer in the transmission region using the half photoresist in the reflection region through the fourth mask process; and thereafter
   eliminating the half photoresist.

7. The method according to claim 6, wherein in the step of forming the reflection plate, the fourth mask process uses a mask having a second zone and a third zone, and a transmittance of the second zone is less than a transmittance of the third zone.

8. The method according to claim 7, wherein in the step of forming the reflection plate, the third zone corresponds to the reflection region of the substrate and the second zone corresponds to the transmission region of the substrate.

9. The method according to claim 6, wherein in the step of forming the passivation layer on the source and drain electrodes, the third mask process uses a mask having a first zone, a second zone and a third zone, and a transmittance of the second zone is smaller than a transmittance of the first zone and is larger than a transmittance of the third zone.

10. The method according to claim 9, wherein the first zone of the mask used in the third mask process corresponds to a portion of the drain electrode in the reflection region and the transmission region, and the second and third zones of the mask used in the third mask process correspond to a portion of the reflection region.

11. A fabrication method of an array substrate for a transflective liquid crystal display device, the method comprising:
    forming a gate pad on a substrate through a first mask process;
    sequentially forming a gate insulator, an intrinsic amorphous silicon layer, an impurity-doped amorphous silicon layer, and a metal layer on the gate pad;
    eliminating the metal layer, the impurity-doped amorphous silicon layer and the intrinsic amorphous silicon layer through a second mask process;
    forming a passivation layer on the gate insulator and having an opening exposing the gate insulator through a third mask process;
    exposing a portion of the gate pad by etching the gate insulator exposed through the opening;
    sequentially forming a transparent conductive layer and a reflection layer on the exposed gate pad;
    forming a gate pad terminal by forming a half photoresist on the reflection layer and selectively etching the reflection layer and the transparent conductive layer through a fourth mask process; and
    eliminating the reflection layer in the gate pad terminal.

12. The method according to claim 11, wherein the fourth mask process uses a mask having first and second zones, and a transmittance of the first zone is larger than a transmittance of the second zone.

13. The method according to claim 11, wherein the third mask process uses a mask having first and second zones, and a transmittance of the first zone is larger than a transmittance of the second zone.

14. The method according to claim 11, further comprising:
    defining a reflection region and a transmission region on the substrate;
    forming a gate electrode in the reflection region through the first mask process, wherein the gate insulator, the intrinsic amorphous silicon layer, the impurity-doped amorphous silicon layer, and the metal layer are also formed on the gate electrode, sequentially;

forming source and drain electrodes by etching the metal layer, and an active layer by selectively etching the impurity-doped amorphous silicon layer between the source and drain electrodes through the second mask process, wherein the passivation layer is also formed on the source and drain electrodes and the active layer and has an embossed surface and a contact hole exposing a portion of the drain electrode through the third mask process, and the transparent conductive layer and the reflection layer are also formed on the passivation layer having the embossed surface and the exposed drain electrode;

forming a reflection plate, by forming the half photoresist also on the reflection layer in the reflection region and selectively etching the reflection layer in the transmission region using the half photoresist in the reflection region through the fourth mask process; and eliminating the half photoresist after the half photoresist is used.

15. The method according to claim 14, wherein in the step of forming the reflection plate, the fourth mask process uses a mask having a second zone and a third zone, and a transmittance of the second zone is less than a transmittance of the third zone.

16. The method according to claim 15, wherein in the step of forming the reflection plate, the third zone corresponds to the reflection region of the substrate and the second zone corresponds to the transmission region of the substrate.

17. The method according to claim 14, wherein in the step of forming the passivation layer on the source and drain electrodes, the third mask process uses a mask having a first zone, a second zone and a third zone, and a transmittance of the second zone is smaller than a transmittance of the first zone and is larger than a transmittance of the third zone.

18. The method according to claim 17, wherein the first zone of the mask used in the third mask process corresponds to a portion of the drain electrode in the reflection region and the transmission region, and the second and third zones of the mask used in the third mask process correspond to a portion of the reflection region.

* * * * *